US 9,953,725 B2

(12) United States Patent
Ryu et al.

(10) Patent No.: US 9,953,725 B2
(45) Date of Patent: *Apr. 24, 2018

(54) SEMICONDUCTOR MEMORY DEVICES AND METHODS OF OPERATING THE SAME

(71) Applicant: Samsung Electronics Co., Ltd., Suwon-si (KR)

(72) Inventors: Ye-Sin Ryu, Seoul (KR); Sang-Uhn Cha, Yongin-si (KR); Hoi-Ju Chung, Yongin-si (KR); Seong-Jin Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/395,213

(22) Filed: Dec. 30, 2016

(65) Prior Publication Data

US 2017/0110206 A1   Apr. 20, 2017

Related U.S. Application Data

(60) Continuation-in-part of application No. 14/698,219, filed on Apr. 28, 2015, now Pat. No. 9,659,669.
(Continued)

(30) Foreign Application Priority Data

May 30, 2016   (KR) .................. 10-2016-0066110

(51) Int. Cl.
*G11C 29/44* (2006.01)
*G11C 29/56* (2006.01)
(Continued)

(52) U.S. Cl.
CPC .......... *G11C 29/44* (2013.01); *G01R 31/3187* (2013.01); *G06F 11/1068* (2013.01);
(Continued)

(58) Field of Classification Search
CPC ..... G11C 29/44; G11C 29/56; G11C 29/4401; G11B 20/1816; G01R 31/3187; G06F 11/27

See application file for complete search history.

(56) References Cited

U.S. PATENT DOCUMENTS

| 4,480,307 A | 10/1984 | Budde et al. |
| 4,627,053 A * | 12/1986 | Yamaki ................. G11C 29/72 714/711 |

(Continued)

FOREIGN PATENT DOCUMENTS

| JP | 2001352038 | 12/2001 |
| JP | 2006186247 | 7/2006 |

(Continued)

OTHER PUBLICATIONS

Japanese OA issued in corresponding Japanese Application No. 2013-036931 dated Oct. 6, 2015.
(Continued)

*Primary Examiner* — Joseph D Torres
(74) *Attorney, Agent, or Firm* — Onello & Mello, LLP.

(57) ABSTRACT

A method of operating a semiconductor memory device is provided. In a method of operating a semiconductor memory device including a memory cell array which includes a plurality of bank arrays, memory cells in a first region of the memory cell array are tested to detect one or more failed cells in the first region, a fail address corresponding to the detected one or more failed cells is determined and the determined fail address is stored in a second region different from the first region, in the memory cell array.

8 Claims, 42 Drawing Sheets

Related U.S. Application Data which is a division of application No. 13/753,165, filed on Jan. 29, 2013, now Pat. No. 9,087,613.

(60) Provisional application No. 61/604,570, filed on Feb. 29, 2012.

(51) Int. Cl.

| | | |
|---|---|---|
| *G11B 20/18* | (2006.01) | |
| *G01R 31/3187* | (2006.01) | |
| *G06F 11/27* | (2006.01) | |
| *G06F 11/10* | (2006.01) | |
| *G11C 29/52* | (2006.01) | |
| *G11C 5/04* | (2006.01) | |
| *G11C 11/40* | (2006.01) | |
| *G11C 17/16* | (2006.01) | |
| *G11C 17/18* | (2006.01) | |
| *G11C 29/02* | (2006.01) | |
| *G11C 29/00* | (2006.01) | |

(52) U.S. Cl.
CPC .......... *G06F 11/27* (2013.01); *G11B 20/1816* (2013.01); *G11C 5/04* (2013.01); *G11C 11/40* (2013.01); *G11C 17/16* (2013.01); *G11C 17/18* (2013.01); *G11C 29/027* (2013.01); *G11C 29/4401* (2013.01); *G11C 29/52* (2013.01); *G11C 29/56008* (2013.01); *G11C 29/785* (2013.01); *G11C 29/787* (2013.01); *G11C 29/56004* (2013.01); *G11C 2029/4402* (2013.01); *G11C 2029/5606* (2013.01)

(56) References Cited

U.S. PATENT DOCUMENTS

| | | | | |
|---|---|---|---|---|
| 4,942,556 A * | 7/1990 | Sasaki | G11C 15/04 | 365/168 |
| 5,313,424 A | 5/1994 | Adams et al. | | |
| 5,357,473 A * | 10/1994 | Mizuno | G11C 29/822 | 365/200 |
| 5,586,075 A | 12/1996 | Miwa | | |
| 5,724,282 A | 3/1998 | Loughmiller et al. | | |
| 5,751,627 A * | 5/1998 | Ooishi | G11C 11/22 | 365/145 |
| 5,793,683 A * | 8/1998 | Evans | G11C 29/846 | 365/189.02 |
| 5,808,944 A * | 9/1998 | Yoshitake | G11C 29/80 | 365/185.09 |
| 5,808,945 A * | 9/1998 | Arase | G11C 29/81 | 365/200 |
| 5,815,449 A | 9/1998 | Taura | | |
| 5,831,915 A * | 11/1998 | Pascucci | G11C 29/24 | 365/189.02 |
| 5,835,424 A * | 11/1998 | Kikukawa | G11C 29/84 | 365/189.07 |
| 5,867,504 A | 2/1999 | Pascucci | | |
| 5,917,764 A * | 6/1999 | Ohsawa | G11C 29/44 | 365/189.07 |
| 5,917,833 A * | 6/1999 | Sato | G01R 31/31935 | 365/201 |
| 5,920,515 A * | 7/1999 | Shaik | G11C 29/84 | 365/200 |
| 5,956,280 A * | 9/1999 | Lawrence | G01R 31/31908 | 324/73.1 |
| 5,983,374 A | 11/1999 | Todome et al. | | |
| 5,987,632 A * | 11/1999 | Irrinki | G11C 29/44 | 365/201 |
| 6,157,585 A * | 12/2000 | Kim | G11C 11/22 | 365/145 |
| 6,256,237 B1 * | 7/2001 | Ho | G11C 29/44 | 365/149 |
| 6,370,661 B1 * | 4/2002 | Miner | G11C 29/12 | 714/31 |
| 6,370,665 B1 * | 4/2002 | Noguchi | G01R 31/318544 | 714/718 |
| 6,388,929 B1 * | 5/2002 | Shimano | G11C 29/44 | 365/200 |
| 6,442,724 B1 * | 8/2002 | Augarten | G11C 29/56008 | 714/738 |
| 6,480,978 B1 * | 11/2002 | Roy | G01R 31/31905 | 714/724 |
| 6,499,121 B1 * | 12/2002 | Roy | G01R 31/31905 | 714/718 |
| 6,538,924 B2 * | 3/2003 | Dono | G11C 14/00 | 365/185.08 |
| 6,542,419 B2 * | 4/2003 | Hasegawa | G11C 29/785 | 365/189.05 |
| 6,552,960 B2 * | 4/2003 | Shirai | G11C 7/20 | 365/189.05 |
| 6,639,857 B2 * | 10/2003 | Kang | G11C 29/789 | 365/185.09 |
| 6,646,930 B2 * | 11/2003 | Takeuchi | G11C 16/20 | 365/200 |
| 6,651,204 B1 * | 11/2003 | Rajsuman | G01R 31/31915 | 714/738 |
| 6,721,920 B2 * | 4/2004 | Rearick | G01R 31/3187 | 324/617 |
| 6,862,704 B1 * | 3/2005 | Miner | G11C 29/12 | 714/31 |
| 6,865,706 B1 * | 3/2005 | Rohrbaugh | G01R 31/318371 | 714/728 |
| 6,993,692 B2 * | 1/2006 | Ouellette | G11C 29/44 | 714/5.11 |
| 7,174,477 B2 | 2/2007 | Derner et al. | | |
| 7,382,680 B2 | 6/2008 | Nakano et al. | | |
| 7,392,443 B2 * | 6/2008 | Braun | G11C 29/12 | 365/201 |
| 7,401,270 B2 | 7/2008 | Hummler | | |
| 7,546,506 B2 * | 6/2009 | Sonoda | G11C 29/48 | 714/736 |
| 7,693,223 B2 * | 4/2010 | Kishigami | G01R 31/31922 | 375/224 |
| 7,694,196 B2 | 4/2010 | Schnell et al. | | |
| 7,734,966 B1 * | 6/2010 | Lee | G11C 29/12015 | 365/201 |
| 7,877,649 B2 | 1/2011 | Kliewer et al. | | |
| 8,509,014 B2 | 8/2013 | Shvydun et al. | | |
| 8,522,072 B2 | 8/2013 | Huang | | |
| 9,087,613 B2 | 7/2015 | Sohn et al. | | |
| 9,401,226 B1 * | 7/2016 | Shin | G11C 29/76 | |
| 2002/0047181 A1 * | 4/2002 | Hasegawa | G11C 17/18 | 257/529 |
| 2002/0062466 A1 * | 5/2002 | Noguchi | G01R 31/318544 | 714/738 |
| 2002/0159310 A1 * | 10/2002 | Park | G11C 29/72 | 365/200 |
| 2003/0226074 A1 | 12/2003 | Ohlhoff et al. | | |
| 2004/0013028 A1 | 1/2004 | Lim | | |
| 2004/0061516 A1 * | 4/2004 | Murata | G01R 31/318505 | 324/750.3 |
| 2004/0108572 A1 * | 6/2004 | Kang | G11C 17/143 | 257/529 |
| 2004/0138845 A1 * | 7/2004 | Park et al. | G01R 31/318357 | 702/108 |
| 2004/0153900 A1 * | 8/2004 | Adams | G11C 29/802 | 714/710 |
| 2004/0218431 A1 | 11/2004 | Chung et al. | | |
| 2004/0234007 A1 * | 11/2004 | Mills | H03M 13/2957 | 375/340 |
| 2005/0166111 A1 * | 7/2005 | Chien | G11C 29/38 | 714/733 |
| 2005/0243617 A1 * | 11/2005 | Kang | G11C 29/808 | 365/200 |
| 2005/0289415 A1 * | 12/2005 | Dean | G01R 31/2886 | 714/724 |
| 2006/0064261 A1 * | 3/2006 | Boldt | G11C 29/48 | 702/80 |
| 2006/0092725 A1 * | 5/2006 | Min | G11C 29/787 | 365/200 |

(56) References Cited

U.S. PATENT DOCUMENTS

| | | | |
|---|---|---|---|
| 2006/0132512 A1* | 6/2006 | Walmsley | B41J 2/04505 347/5 |
| 2006/0268634 A1* | 11/2006 | Ogawa | G11C 29/838 365/200 |
| 2006/0274112 A1* | 12/2006 | Jackson Pulver | B41J 2/04505 347/42 |
| 2007/0070743 A1 | 3/2007 | Do et al. | |
| 2007/0136640 A1* | 6/2007 | Jarrar | G11C 11/005 714/763 |
| 2007/0255981 A1* | 11/2007 | Eto | G06F 11/1008 714/710 |
| 2008/0065929 A1* | 3/2008 | Nadeau-Dostie | G11C 29/4401 714/5.11 |
| 2008/0191990 A1* | 8/2008 | Matsubara | G09G 3/20 345/98 |
| 2008/0282107 A1* | 11/2008 | Hung | G11C 29/56 714/6.13 |
| 2009/0085599 A1* | 4/2009 | Choi | G01R 31/2884 324/750.27 |
| 2010/0023924 A1* | 1/2010 | Meijer | G06F 8/427 717/106 |
| 2010/0271897 A1* | 10/2010 | Naritake | G11C 17/16 365/225.7 |
| 2010/0290299 A1 | 11/2010 | Matsumoto et al. | |
| 2011/0051538 A1* | 3/2011 | Lunde | G11C 29/76 365/200 |
| 2011/0280091 A1 | 11/2011 | Rooney et al. | |
| 2014/0025880 A1 | 1/2014 | Yu et al. | |
| 2014/0078842 A1 | 3/2014 | Oh et al. | |
| 2014/0146624 A1 | 5/2014 | Son et al. | |
| 2014/0185397 A1 | 7/2014 | Franceschini et al. | |
| 2014/0258780 A1* | 9/2014 | Eyres | G11C 29/16 714/30 |
| 2015/0098287 A1 | 4/2015 | Lee | |
| 2015/0155055 A1* | 6/2015 | Kim | G11C 17/16 365/96 |
| 2015/0243374 A1 | 8/2015 | Sohn et al. | |

FOREIGN PATENT DOCUMENTS

| | | |
|---|---|---|
| JP | 2007109359 | 4/2007 |
| WO | 0156038 | 8/2001 |
| WO | 2011081846 | 7/2011 |

OTHER PUBLICATIONS

"Device and Method for Repairing Memory Cell and Memory System Including the Device" Specification, Drawings, and Prosecution History, of U.S. Appl. No. 14/698,219, filed Apr. 28, 2015, by Kyo-Min Sohn, et al., which is stored in the United States Patent and Trademark Office (USPTO).

* cited by examiner

FIG. 13

| Case | Verification Result | | | Description |
|---|---|---|---|---|
| | DQ0 | DQ1 | DQ2 | |
| 1 | Low | Low | Low | OK (fail bit is replaced by row redundant cells) |
| 2 | Low | Low | High | OK (fail bit is replaced by column redundant cells) |
| 3 | Low | High | Low | OK (fail bit is replaced by single redundant cell) |
| 4 | Low | High | High | RFU (reservde for future use) |
| 5 | High | Low | Low | Fail (rupture process had some problems) |
| 6 | High | Low | High | Fail (rupture process is still in progress) |
| 7 | High | High | Low | Fail (there is no available redundant cell) |
| 8 | High | High | High | This chip is not selected for repair process |

FIG. 15

Case1 (LLL): OK (fail bit is replaced by row redundant cells)

|     | 1st | 2nd | 3rd | 4th  | 5th  | 6th  | 7th  | 8th  |
| --- | --- | --- | --- | ---- | ---- | ---- | ---- | ---- |
| DQ0 | Low | Low | Low | High | High | High | High | High |
| DQ1 | Low | Low | Low | High | High | High | High | High |
| DQ2 | Low | Low | Low | High | High | High | High | High |
| DQ3 | Low | Low | Low | High | High | High | High | High |

Case6 (HLH): Fail (rupture process is still in progress)

|     | 1st  | 2nd | 3rd  | 4th  | 5th  | 6th  | 7th  | 8th  |
| --- | ---- | --- | ---- | ---- | ---- | ---- | ---- | ---- |
| DQ0 | High | Low | High | High | High | High | High | High |
| DQ1 | High | Low | High | High | High | High | High | High |
| DQ2 | High | Low | High | High | High | High | High | High |
| DQ3 | High | Low | High | High | High | High | High | High |

SEMICONDUCTOR MEMORY DEVICES AND METHODS OF OPERATING THE SAME

CROSS-REFERENCE TO RELATED APPLICATION

This application is a continuation-in-part application of U.S. application Ser. No. 14/698,219 filed on Apr. 28, 2015, which is a divisional application of U.S. application Ser. No. 13/753,165, filed Jan. 29, 2013, now U.S. Pat. No. 9,087,613, issued on Jul. 21, 2015, which claimed the benefit of provisional U.S. Application No. 61/604,570 filed on Feb. 29, 2012, and this application also claims the benefit of priority under 35 USC § 119 to Korean Patent Application No. 10-2016-0066110, filed on May 30, 2016, in the Korean. Intellectual Property Office, the entire contents of which are incorporated herein by reference in their entirety.

BACKGROUND

1. Technical Field

Exemplary embodiments relates to memory devices, and more particularly, to semiconductor memory devices and methods of operating the same.

2. Discussion of the Related Art

A semiconductor memory device is a memory device that is embodied in a structure that uses a semiconductor for data and information storage. Examples of such semiconductors include silicon Si, germanium Ge, gallium arsenide GaAs, indium phosphide InP, etc. Semiconductor memory devices are classified into volatile memory devices and nonvolatile memory devices.

A volatile memory device loses its stored data when its power supply is interrupted. Examples of the volatile memory device include a static RAM (SRAM), a dynamic RAM (DRAM), a synchronous DRAM (SDRAM), etc.

A DRAM includes a plurality of memory cells being arranged in a matrix form. As the integration and the speed of semiconductor memory devices increases, a ratio of cells of the semiconductor memory devices which are failed cells that do not operate correctly is increasing. To improve yield of a semiconductor memory device, a method of efficiently repairing a failed cell may be desirable.

SUMMARY

Some exemplary embodiments provide a method of operating a semiconductor memory device, capable of increasing usability and enhancing performance.

Some exemplary embodiments provide a semiconductor memory device, capable of increasing usability and enhancing performance.

According to exemplary embodiments, in a method of operating a semiconductor memory device including a memory cell array which includes a plurality of bank arrays, memory cells in a first region of the memory cell array are tested to detect one or more failed cells in the first region, a fail address corresponding to the detected one or more failed cells is determined and the determined fail address is stored in a second region different from the first region, in the memory cell array.

According to exemplary embodiments, a semiconductor memory device includes a memory cell array, a test/repair manage circuit, and a control logic circuit. The memory cell array includes a plurality of bank arrays. The test/repair manage circuit tests memory cells in a first region of the memory cell array to detect one or more failed cells in the first region in response to a mode signal indicating a test mode of the semiconductor memory device, determines a fail address corresponding to the detected one or more failed cells and stores the determined fail address in a second region in the memory cell array. The second region is different from the first region. The control logic circuit generates at least the mode signal by decoding a command provided from an outside.

Accordingly, a test/repair manage circuit may test memory cells in a first region of a memory cell array, may store a fail address corresponding to one or more failed cells in a second region of the memory cell array in a test mode. Therefore, a semiconductor memory device may increase usability of the memory cell array in the test mode, may not require an extra memory that stores the fail address during the test operation, and the semiconductor memory device may decrease an occupied area. In addition, the repair operation is performed after the semiconductor memory device is packaged, performance of the semiconductor memory device may be enhanced.

According to exemplary embodiments, a packaged semiconductor memory device comprises a memory cell array including a plurality of bank arrays and a test circuit configured to test memory cells in a first region of the memory cell array associated with a first word line, to identify an address of a failed memory cell, and to store the address of the failed memory cell in a second region of the memory cell array associated with a second word line. The test circuit initiates the test in response to a command received by the packaged semiconductor device.

BRIEF DESCRIPTION OF THE DRAWINGS

The inventive concept will be apparent from the description of exemplary embodiments and the accompanying drawings, in which like reference characters refer to the same parts throughout the different views. In the drawings:

FIG. 13 is a table illustrating an exemplary embodiment of verification results to be transmitted in parallel, in accordance with aspects of the inventive concept;

FIG. 15 is a table illustrating an exemplary embodiment of verification results to be transmitted in series, in accordance with aspects of the inventive concept;

DETAILED DESCRIPTION OF THE EMBODIMENTS

Various embodiments will now be described more fully with reference to the accompanying drawings.

FIGS. 1 to 4 are conceptual diagrams of embodiments of memory test systems in accordance with aspects of the inventive concept.

Figure 1:
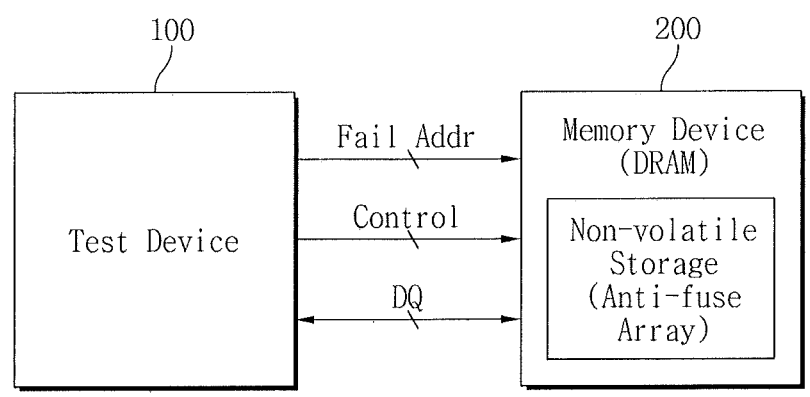
FIGS. 1 to 4 are conceptual diagrams of exemplary embodiments of memory test systems, in accordance with aspects of the inventive concept.

Referring to FIG. 1, a memory test system includes a test device 100 and a memory device 200. The test device 100 transmits a control signal including a fail address, a command with instruction to operate the memory device 200, and data DQ. Although not shown, the test device 100 may be included in a memory controller or a piece of test equipment. In this embodiment, the memory device 200 includes a dynamic random access memory (DRAM), which is a type volatile memory. Alternatively, the memory device 200 may include a non-volatile memory, e.g., a magneto-resistive RAM (MRAM), a resistive RAM (RRAM), a phase-change RAM (PRAM), or a NAND flash memory, as examples. In the presently preferred form, the memory device 200 includes a non-volatile storage device 280 including an anti-fuse array. The non-volatile storage device 280 is used to store the fail address. The memory device 200 operates according to the control signal, and transmits the data DQ to the test device 100.

Figure 2:
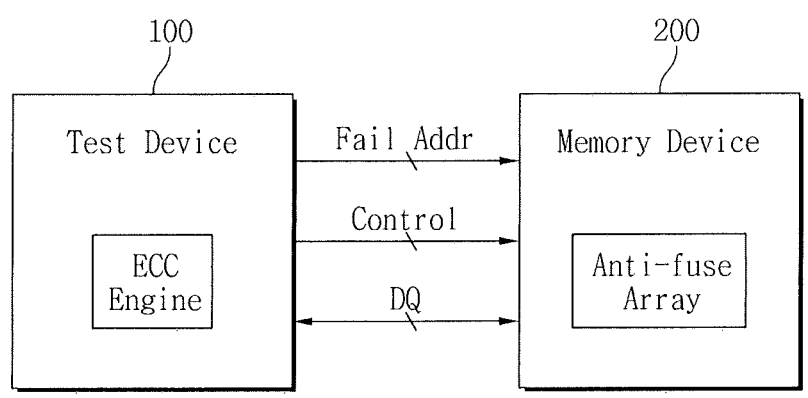

Referring to the embodiment of FIG. 2, an embodiment of the test device 100 may include an error correcting code (ECC) engine 120. The ECC engine 120 may be configured to detect a fail bit and a fail address from data DQ received from a memory device 200, and to correct the fail bit. The memory device 200 includes anti-fuse array 280, which stores the fail address received from the test device 100. A fail memory cell, from a memory array of the memory device 200, is repaired based on the stored fail address, as will be discussed below.

Figure 3:
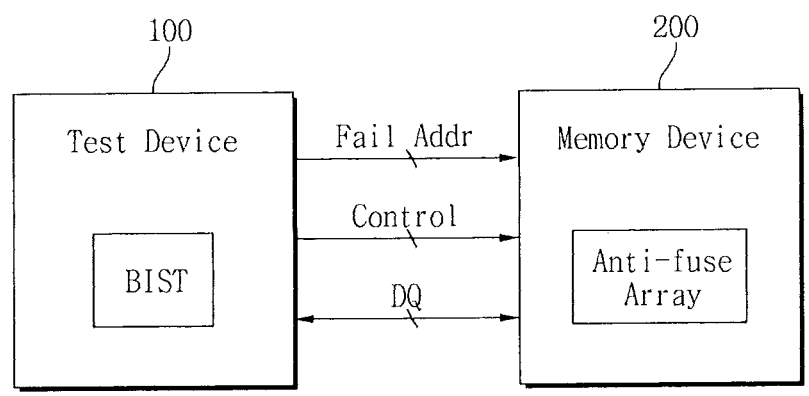

Referring to the embodiment of FIG. 3, an embodiment of the test device 100 may include a built-in self-test (BIST) unit 120. The BIST unit 120 may be configured to test the test device 100 or the memory device 200. To test the memory device 200, test data is generated and transmitted to the memory device 200. A fail memory cell is detected by writing the test data to a memory cell and then reading the test data from the memory cell. A fail address, that is the address of the fail memory cell, is temporarily stored in the test device 100 and is then transmitted to the memory device 200. The transmitted fail address is stored in the anti-fuse array 280, and subsequently used to repair the fail memory cell corresponding to the fail address.

Figure 4:
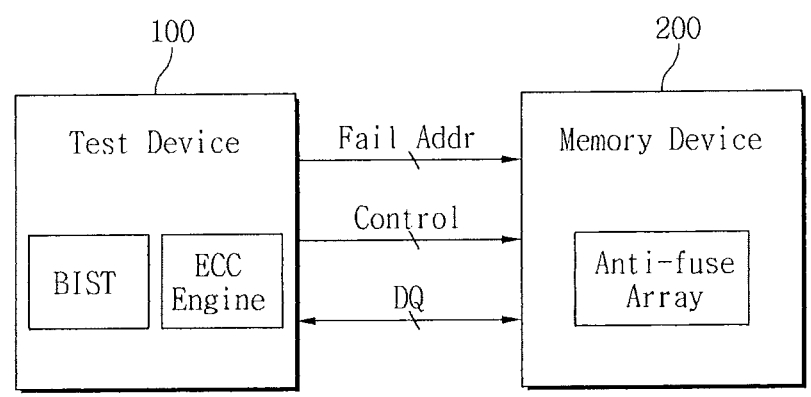

Referring to the embodiment of FIG. 4, an embodiment of the test device 100 may include a BIST unit and an ECC engine 120. A memory device 200 may be tested using the BIST unit and a fail address may be stored in the anti-fuse array 280 included in the memory device 200. The fail address, which is the address of a fail bit occurring during an operation of the memory device 200, is detected using the ECC engine 120, and is stored in the anti-fuse array of the memory device 200. When the memory device 200 does not operate, the memory device 200 may be tested by using the BIST unit according to a test command given from a central processing unit (CPU). While the memory device 200 operates, the fail address may be detected using the ECC engine.

Figure 5:
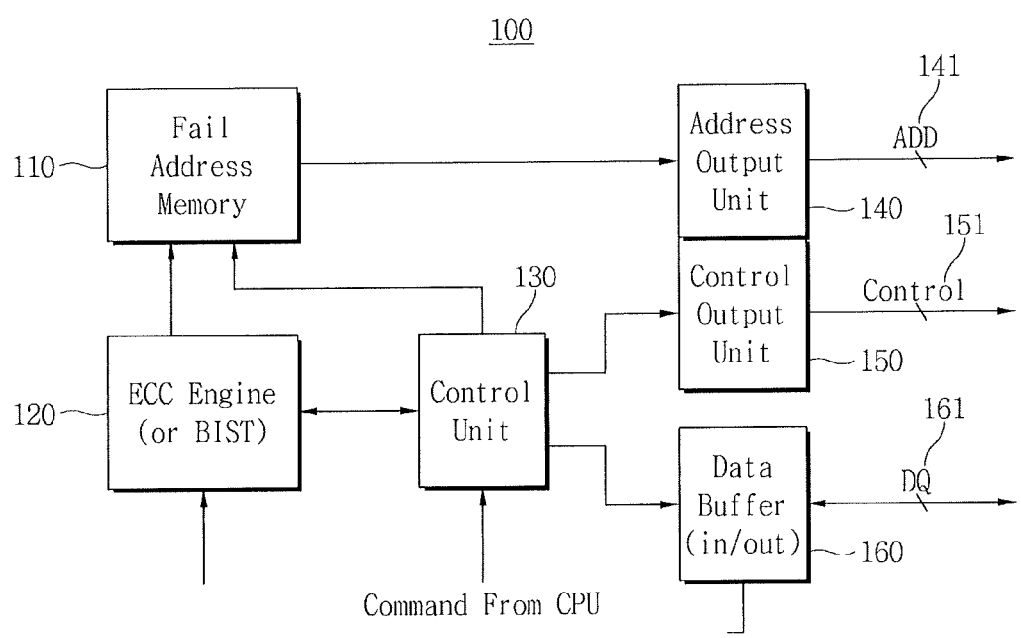
FIG. 5 illustrates an exemplary embodiment of a circuit block of a test device, in accordance with aspects of the inventive concept.

FIG. 5 illustrates a circuit block diagram of an embodiment of a test device 100, in accordance with aspects of the inventive concept.

Referring to the embodiment of FIG. 5, the test device 100 includes a fail address memory (FAM) 110, an ECC engine (and/or BIST unit) 120, a control unit 130, an address output buffer 140, a control output unit 150, and an input/output (I/O) data buffer 160. The fail address memory 110 stores a fail address ADD 141 detected by the ECC engine (or BIST unit) 120. The fail address memory 110 may be embodied as a register, a static random access memory (SRAM), or a non-volatile memory, as examples. The address output buffer 140 is connected to the fail address memory 110 and transmits the fail address ADD 141 to the memory device 200. The control output unit 150 transmits a control signal 151 including a read command, a write command, a pre-charge command, a mode register set (MRS) command, and the like, to the memory device 200. The control output unit 150 is connected to and is controlled by control unit 130. The I/O data buffer 160 is controlled by the control unit 130, and receives or transmits input/output (I/O) data. The I/O data may include only test data for testing the memory device 200.

Data received from the memory device 200 is transmitted to the ECC engine (and/or BIST unit) 120 via the I/O data buffer 160. The control unit 130 is connected to the ECC engine (and/or BIST unit) 120, the fail address memory 110, the address output unit 140, the control output buffer 150, and the I/O data buffer 160. The control unit 130 receives a test command from a CPU. The test command may be corresponded to a test start command, a test exit command, a command that instructs a start of transmission of the fail address ADD, and a command that instructs an end of the transmission of the fail address ADD. The fail address ADD 141 detected by the ECC engine (or BIST unit) 120 is controlled to be stored in the fail address memory 110, according to the received test command. Also, transmission of the fail address ADD 141 and the control signal 151 are controlled using the address output unit 140 and the control output unit 150.

Figure 6A:
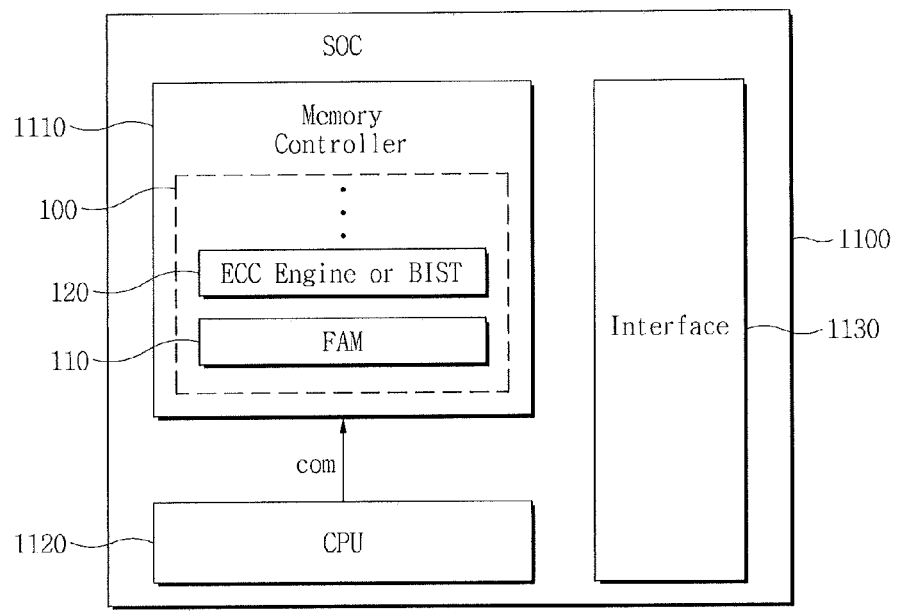
FIG. 6A is a diagram illustrating an exemplary embodiment of a system-on-chip (SOC) including a test device therein, in accordance with aspects of the inventive concept.

FIG. 6A is a diagram illustrating an embodiment of a system-on-chip (SOC) 1100 having a test device 100 therein, in accordance with aspects of the inventive concept.

Referring to FIG. 6A, the SOC 1100 includes a CPU 1120, a memory controller 1110, and an interface 1130. The memory controller 1110 includes the test device 100, in this embodiment. The test device 100 includes an ECC engine (and/or BIST unit) 120, a fail address memory (FAM) 110, a control unit, and so on, which are elements of the test device 100 illustrated in FIG. 5. The memory controller 1110 is connected to the CPU 1120 to receive a test command Com from the CPU 1120. The test command Com may be corresponded to a test start command, a test exit command, a command that instructs to start of transmission of a fail address, and a command that instructs and end of the transmission of the fail address. A fail address, a control signal, and data are transmitted to the memory device 200 via the interface 1130.

Figure 6B:
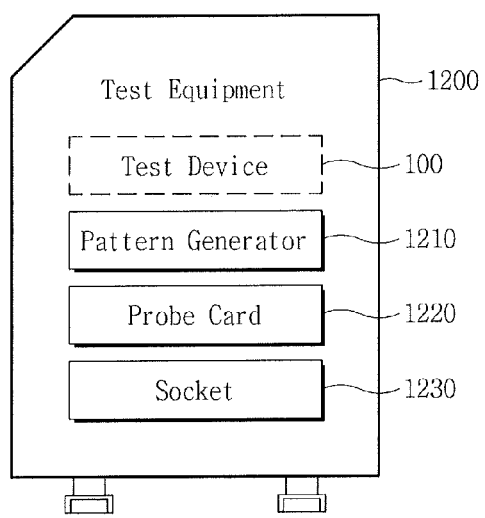
FIG. 6B is a diagram illustrating an exemplary embodiment of test equipment using a test device, in accordance with aspects of the inventive concept.

FIG. 6B is a diagram illustrating test equipment 1200 using a test device 100 in accordance with an embodiment of the inventive concept.

Referring to FIG. 6B, the test equipment 1200 includes the test device 100, a pattern generator 1210, a probe card 1220, and a socket 1230. The pattern generator 1200 generates various test data to test the memory device 200. The probe card 1220 directly contacts a test pad of the memory device 200 via a probe needle so as to transmit the test data. The socket 1230 removably fixes the memory device 200 during a test of the memory device 200.

Figure 7:
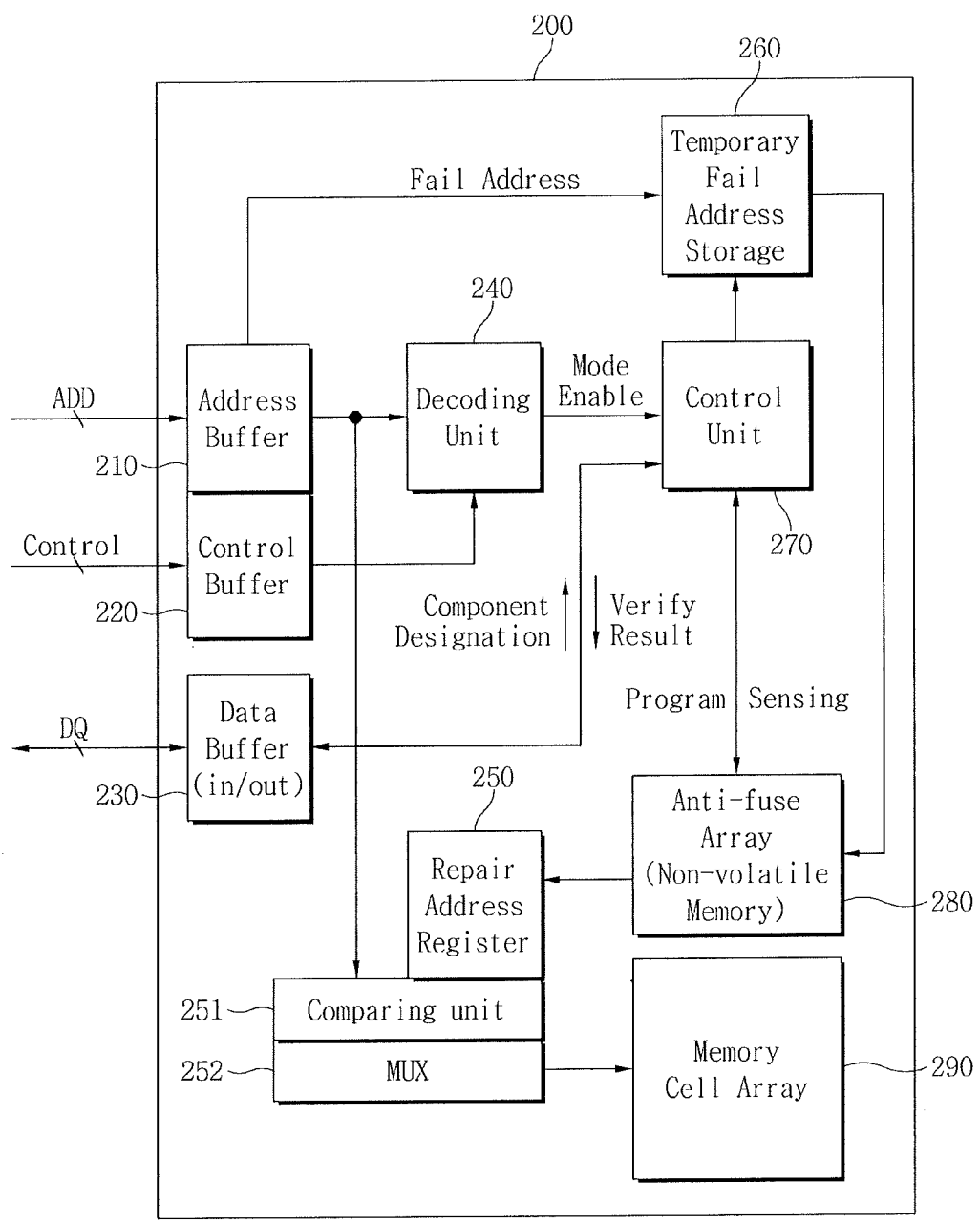
FIG. 7 illustrates a circuit block of an exemplary embodiment of a memory device, in accordance with aspects of the inventive concept.

FIG. 7 illustrates a circuit block diagram of an embodiment of a memory device 200, in accordance with aspects of the inventive concept.

Referring to the embodiment of FIG. 7, the memory device 200 includes an address buffer 210, a control buffer 220, a data buffer 230, a decoding unit 240, a repair address register 250, a comparing unit 251, a multiplexer (Mux) 252, a temporary fail address storage (TFAS) 260, a control unit 270, an anti-fuse array 280 which is a non-volatile storage device, and a memory cell array 290.

A fail address is received via the address buffer 210 and is temporarily stored in the temporary fail address storage 260. The temporary fail address storage 260 may be embodied as a register array, an SRAM, or a non-volatile memory, as examples. The decoding unit 240 receives a control signal via the control buffer 220, performs decoding, and generates a mode enable signal. The control signal includes a read command, a write command, a pre-charge command, a mode register set signal, and the like. The control unit 270 is activated according to the mode enable signal, and stores the fail address in the anti-fuse array 280, which is a non-volatile memory storage device. The control unit 270 senses the stored fail address to verify whether the fail address is accurately programmed. A result of the programming (verification result) is transmitted to the test device 100 via a data output pin. The anti-fuse array 280, which is a non-volatile storage device, is connected to the repair address register 250 configured to store the fail address. The repair address register 250 is connected to the comparing unit 251, which is configured to compare the fail address with an external address. The comparing unit 251 is connected to the multiplexer (Mux) 252, which is configured to select one of the fail address and the external address. Data received via the I/O data buffer 230 may be used as a chip selection signal (component designation) for selecting a chip on a memory module.

Figure 8:
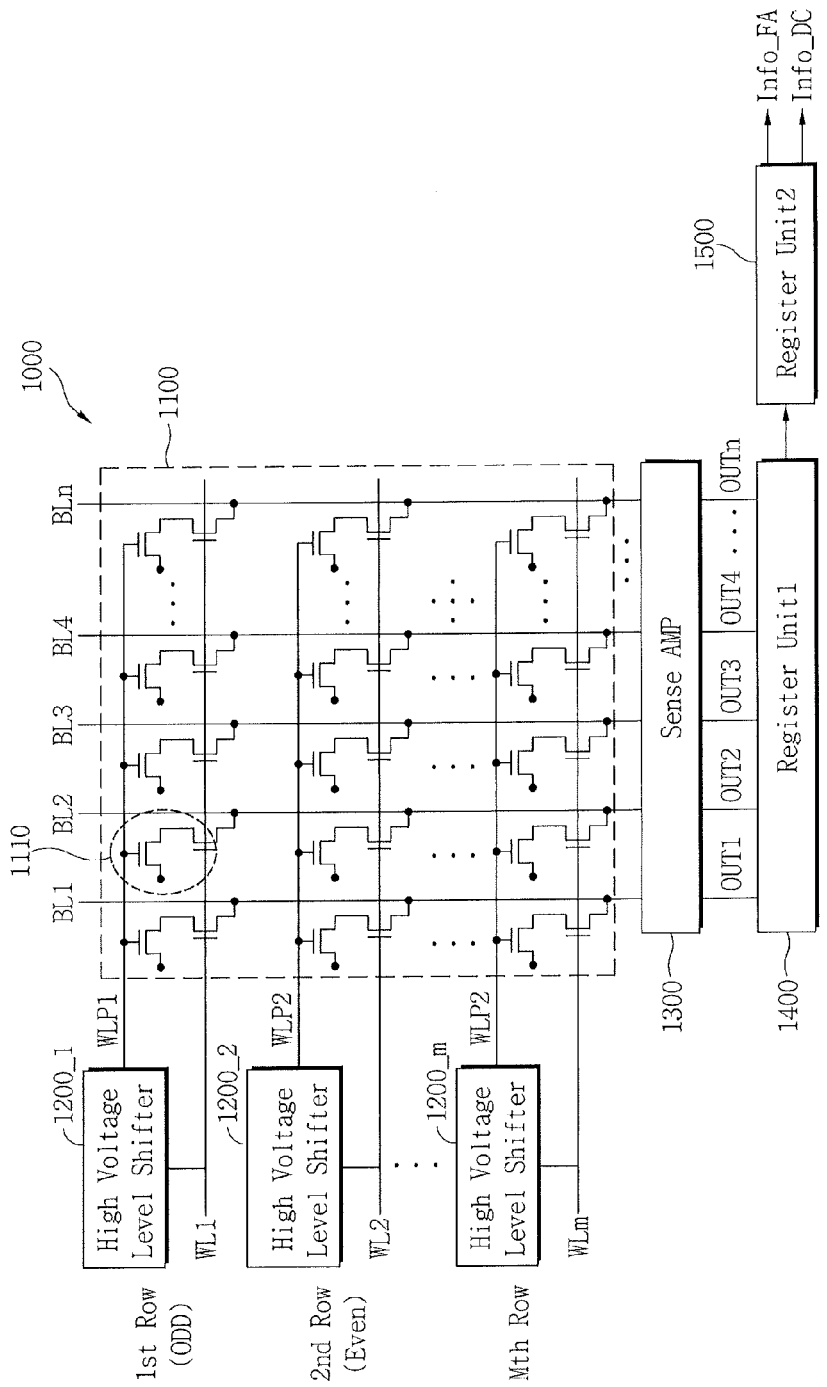
FIG. 8 is a diagram illustrating an exemplary embodiment of a non-volatile storage device, in accordance with aspects of the inventive concept.

FIG. 8 is a diagram illustrating an embodiment of a non-volatile storage device 1000, in accordance with aspects of the inventive concept.

Referring to the embodiment of FIG. 8, the non-volatile storage device 1000 includes a fuse array 1100 on which a plurality of fuses 1110 is disposed, level shifters 1200_1 to 1200_$m$ that generate a high voltage to change resistance states of the plurality of fuses 1110, and a sense amplifier 1300 that senses/amplifies information stored in the fuse array 1100. The non-volatile storage device 1000 further includes a first register unit 1400 and a second register unit 1500 to store fuse data generated when information stored in the anti-fuse array 1100 is read. Each of the first register unit 1400 and the second register unit 1500 may be embodied in a shift register having a plurality of registers.

The fuse array 1100 includes the plurality of fuses 1110 in which information is stored. The fuse array 1100 may include laser fuses, the connections of which are controlled through laser irradiation, or may include electric fuses, the connections of which are controlled according to an electrical signal. Otherwise, the fuse array 1100 may include anti-fuses, the states of which are changed from a high resistance state to a low resistance state, according to an electrical signal, e.g., a high-voltage signal. The fuse array 1100 may include any type of fuses among the various types of fuses described above. In the following embodiment, it is assumed that the fuse array 1100 is an anti-fuse array including anti-fuses. Also, information stored in the anti-fuses or data read from the anti-fuses will be hereinafter referred to as fuse data.

In the presently preferred embodiment, the anti-fuse array 1100 has an array structure in which fuses from the plurality of fuses 1110 are disposed at intersections of a plurality of rows and a plurality of columns. For example, if the anti-fuse array 1100 includes m rows and n columns, then the anti-fuse array 1100 includes m×n anti-fuses 1110. The anti-fuse array 1110 includes in word lines WL1 to WLm for accessing the anti-fuses 1110 disposed in the m rows, and n bit lines BL1 to BLn disposed to correspond to the n columns to deliver information read from the plurality of anti-fuses 1110.

The anti-fuse array 1100 stores various information related to an operation of the non-volatile storage device 1000. For example, the anti-fuse array 1100 may store a plurality of pieces of setting information for setting an operating environment of the non-volatile storage device 1000. The plurality of pieces of setting information are programmed by changing the states of the plurality of anti-fuses 1110 by supplying voltage signals WLP1 to WLPm provided from the level shifters 1200_1 to 1200_$m$ to the anti-fuse array 1100. Information is stored in the plurality of anti-fuses 1110 by programming the plurality of anti-fuses 1110 from the high resistance state to the low resistance state, unlike a general fuse circuit, e.g., a laser fuse circuit or an electric fuse circuit. The plurality of anti-fuses 1110 may have a structure in which a dielectric layer is disposed between two conductive layers, i.e., a capacitor structure. The plurality of anti-fuses 1110 is programmed by breaking down the dielectric layer, which is accomplished by applying high voltage between the two conductive layers.

After the anti-fuse array 1100 is programmed, a read operation is performed on the anti-fuse array 1100, together with start of driving of the non-volatile storage device 1000. The read operation may be performed on the anti-fuse array 1100 simultaneously with the driving of the anti-fuse array 1100 or a predetermined set time after the driving of the non-volatile storage device 1000. In the anti-fuse array 1100, a word line selection signal is provided via the word lines WL1 to WLm, and information stored in a selected anti-fuse 1110 is provided to the sense amplifier 1300 via the bit lines BL1 to BLn. According to characteristics of the array structure, the information stored in the anti-fuse array 1100 may be randomly accessed by driving the word lines WL1 to WLm and the bit lines BL1 to BLn.

For example, as the word lines WL1 to WLm are sequentially driven, the plurality of anti-fuses 1110 are sequentially accessed from a first row to an $m^{th}$ row in the anti-fuse array 1100. The information that is sequentially accessed from the plurality of anti-fuses 1110 is provided to the sense amplifier 1300. The sense amplifier 1300 includes one or more sense amplifier circuits. For example, when the anti-fuse array 1100 includes n columns, the sense amplifier 1300 includes n sense amplifier circuits corresponding to the n columns. The n sense amplifier circuits are connected to the n bit lines BL1 to BLn, respectively. FIG. 1 illustrates a case in which two sense amplifier circuits are disposed to correspond to each of the n bit lines BL1 to BLn. For example, an odd-numbered sense amplifier circuit and an even-numbered sense amplifier circuit are disposed to correspond to a first bit line BL1. The odd-numbered sense amplifier circuit senses/amplifies and outputs information stored in the anti-fuses 1110 connected to odd-numbered word lines WL1, WL3, WL5, . . . . The even-numbered sense amplifier circuit senses/amplifies and outputs information stored in the anti-fuses 1110 connected to even-numbered word lines WL2, WL4, WL6, . . . . However, the inventive concept is not limited thereto, and sense amplifier circuits may be arranged in any of various shapes. As examples, only one sense amplifier circuit may be arranged to correspond to one bit line, or three or more sense amplifier circuits may be arranged to correspond to one bit line.

The sense amplifier 1300 senses/amplifies and outputs the information accessed from the anti-fuse array 1100. The sensed/amplified information is fuse data OUT1 to OUTn that is actually used to set an operating environment of the non-volatile storage device 1000. As described above, since FIG. 1 illustrates a case in which two sense amplifier circuits are provided to correspond to each bit line, actually, a piece of fuse data, e.g., first fuse data OUT1, may include an odd-numbered piece of fuse data and an even-numbered piece of fuse data.

The fuse data OUT1 to OUTn output from the sense amplifier 1300 is provided to the first register unit 1400. The first register unit 1400 may be embodied as a shift register in which a plurality of registers is connected in series to sequentially deliver a signal. Also, the number of registers included in the first register unit 1400 is less than that of the plurality of anti-fuses 1110 included in the anti-fuse array 1100. Also, the number of registers included in the first register unit 1400 may be determined based on that of columns included in the anti-fuse array 1100. For example, when the anti-fuse array 1100 includes n columns, the first register unit 1400 may include n registers. Otherwise, as described above, when two sense amplifier circuits are arranged to correspond to each bit line, the first register unit 1400 may include 2×n registers.

The first register unit 1400 receives the fuse data OUT1 to OUTn in units of the rows in the anti-fuse array 1100. For example, when one row is selected from among the rows of the anti-fuse array 1100, fuse data OUT1 to OUTn stored in anti-fuses 1110 connected to a word line of the selected row is provided in parallel to the first register unit 1400. The first register unit 1400 provides the fuse data OUT1 to OUTn to the second register unit 150 by shifting the provided fuse data OUT1 to OUTn in units of bits. The second register unit 1500 may be embodied as a shift register in which a plurality of registers is connected in series to sequentially deliver a signal. The number of registers included in the second register unit 1500 may be equal to that of the plurality of anti-fuses 1110 included in the anti-fuse array 1100. Fuse data OUT1 to OUTn stored in the second register unit 1500 may be used as information for setting an operating environment of the non-volatile storage device 1000. For example, some of the fuse data OUT1 to OUTn stored in the second register unit 1500 may be used as information Info_FA for replacing a memory cell (not shown) included in the non-volatile storage device 1000 with a redundant memory cell, and some of the fuse data OUT1 to OUTn may be used as trimming information Info_DC for adjusting a voltage generated in the non-volatile storage device 1000.

To store the fuse data OUT1 to OUTn from the anti-fuse array 1100, the followings are used, in the preferred embodiment: (i) registers connected to the sense amplifier 1300 are used to temporarily store the fuse data OUT1 to OUTn; and (ii) registers coupled to various circuit blocks of the non-volatile storage device 1000, e.g., a row and column decoder or a direct-current (DC) voltage generator, are used to provide fuse data OUT1 to OUTn to the circuit blocks.

In accordance with an exemplary embodiment of the inventive concept, the first register unit 1400 receives the fuse data OUT1 to OUTn from the sense amplifier 1300, and transmits the fuse data OUT1 to OUTn to the second register unit 1500 coupled to these circuit blocks. In particular, in this embodiment, the anti-fuse array 1100 has the array structure, and the first register unit 1400 includes the registers, the number of which corresponds to that of columns included in the anti-fuse array 1100. Thus, the number of registers included in the first register unit 1400 is less than that of the plurality of anti-fuses 1110 included in the anti-fuse array 1100. For example, when one sense amplifier circuit is arranged to correspond to each bit line, the first register unit 1400 includes 11 sense amplifier circuits. Thus, the number of registers in the first register unit 1400 related to the fuse data OUT1 to OUTn need not be m×n and may thus be n. In particular, even if a large number of anti-fuses 1110 are included in the anti-fuse array 1100, the number of registers included in the first register unit 1400 may be limited to n, according to the structure of the anti-fuse array 1100. Accordingly, the number of registers included in the first register unit 1400 may be prevented from being proportionally increased.

Figure 9:
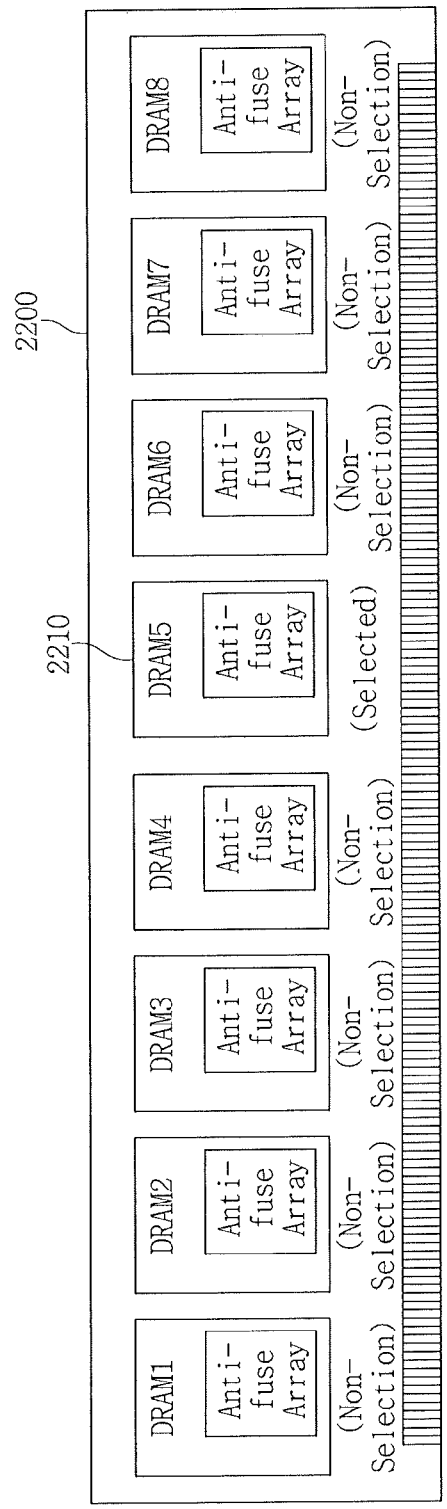
FIG. 9 illustrates an exemplary embodiment of a structure of a memory module, in accordance with aspects of the inventive concept.

FIG. 9 illustrates an embodiment of a structure of a memory module 2200, in accordance with aspects of the inventive concept.

Referring to the embodiment of FIG. 9, the module 2200 includes one or more memory devices in accordance with aspects of the inventive concept. For example, the module 2200 includes eight DRAMs. Each of the DRAMs includes an anti-fuse array, which is a non-volatile storage device. When a fail address is stored in a DRAM5, for example, a memory controller may select the DRAM5 by transmitting data '0' to only the DRAM5. The anti-fuse array included in each of the DRAMs is used to store a generated fail address in the DRAM. A command and an address are shared by the eight DRAMs.

Figure 10:
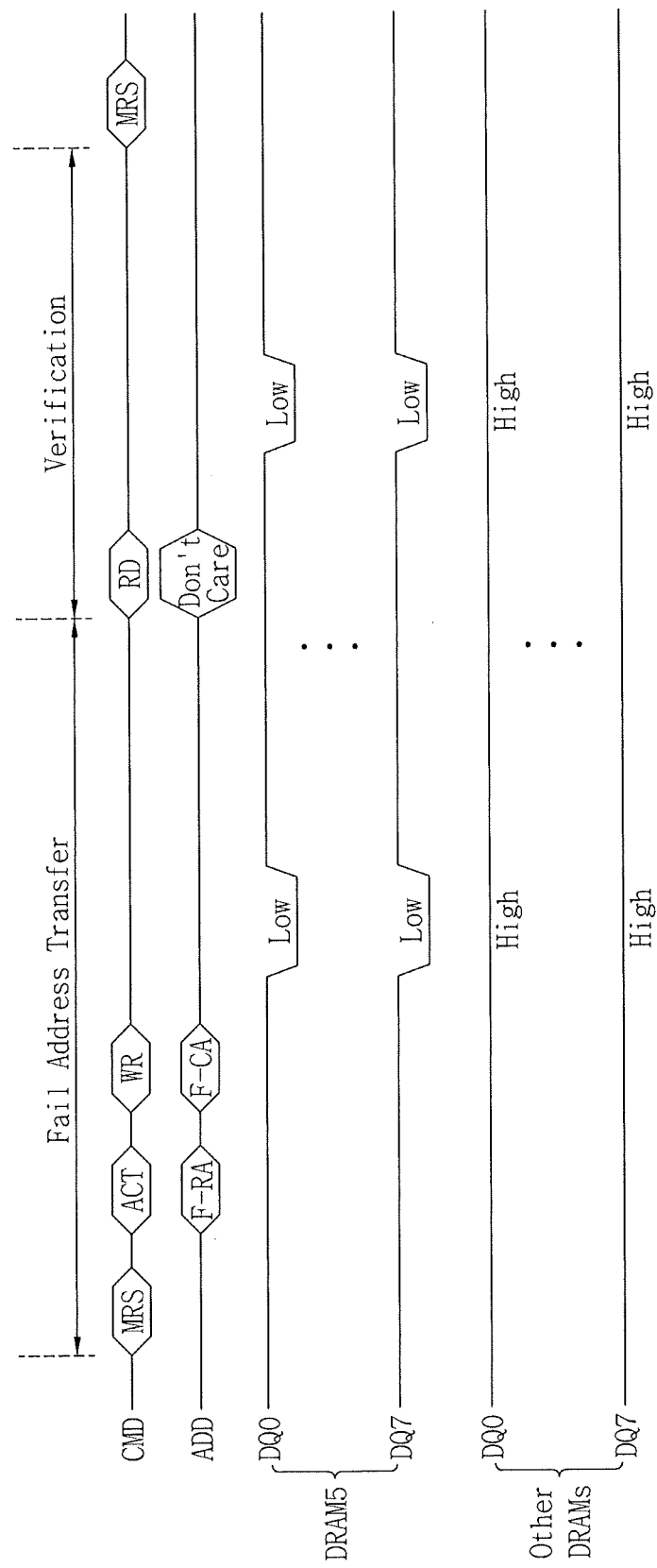
FIGS. 10 and 11 are timing diagrams illustrating an exemplary embodiment of timing when a fail address is transmitted, in accordance with aspects of the inventive concept.
Figure 11:
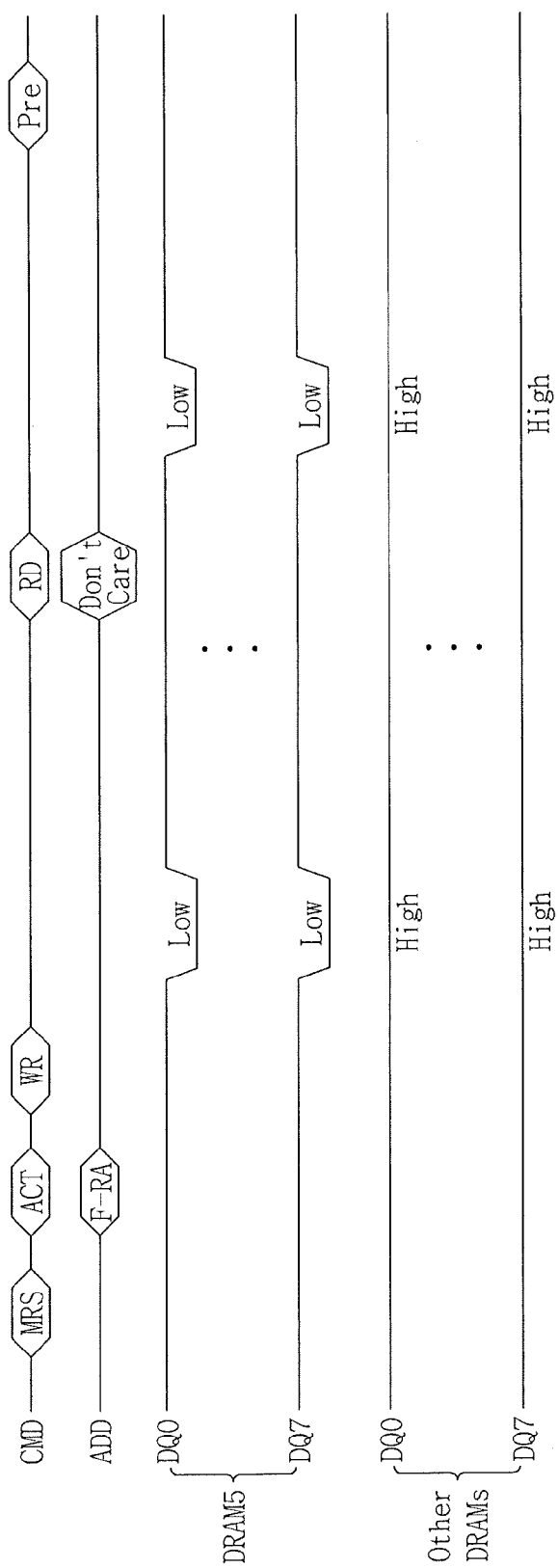

FIGS. 10 and 11 are embodiments of timing diagrams illustrating timing when a fail address is transmitted, in accordance with aspects of the inventive concept.

Referring to FIG. 10, a mode set register command MRS, an active command ACT, a read command RD, and a write command WR are received via a command line CMD. A row fail address F-RA and a column fail address F-CA are received via an address line ADD. In the module 2200 of FIG. 9, the DRAM5 may be selected among the eight DRAMs by receiving only data '0' (logic low) via a data pin DQ. Since data received via data pins DQ0 to DQ7 all becomes logic 'low,' a fail address is thus stored in the anti-fuse array, which is a non-volatile storage device included in the DRAM5. After the mode register set command MRS, the active command ACT, and the write command WR are sequentially input and the row fail address F-RA and the column fail address F-CA are input, data '0' is supplied as final chip selection data via the data pin DQ and the fail address is stored in the anti-fuse array. This section is a fail address transfer section. A section between when the programmed fail address is read according to the read command RD and when another mode register set command MRS is received is a verification section. A verification process is completed when the other mode register set command MRS is input after the read command is received.

The timing diagram of FIG. 11 is similar to the timing diagram of FIG. 10, except that a memory cell corresponding to a fail address is repaired by receiving only a row fail address F-RA via an address line ADD. Also, when a verification process is performed to read the fail address again, the verification process is completed according to a pre-charge command and a current mode is exited.

Figure 12:
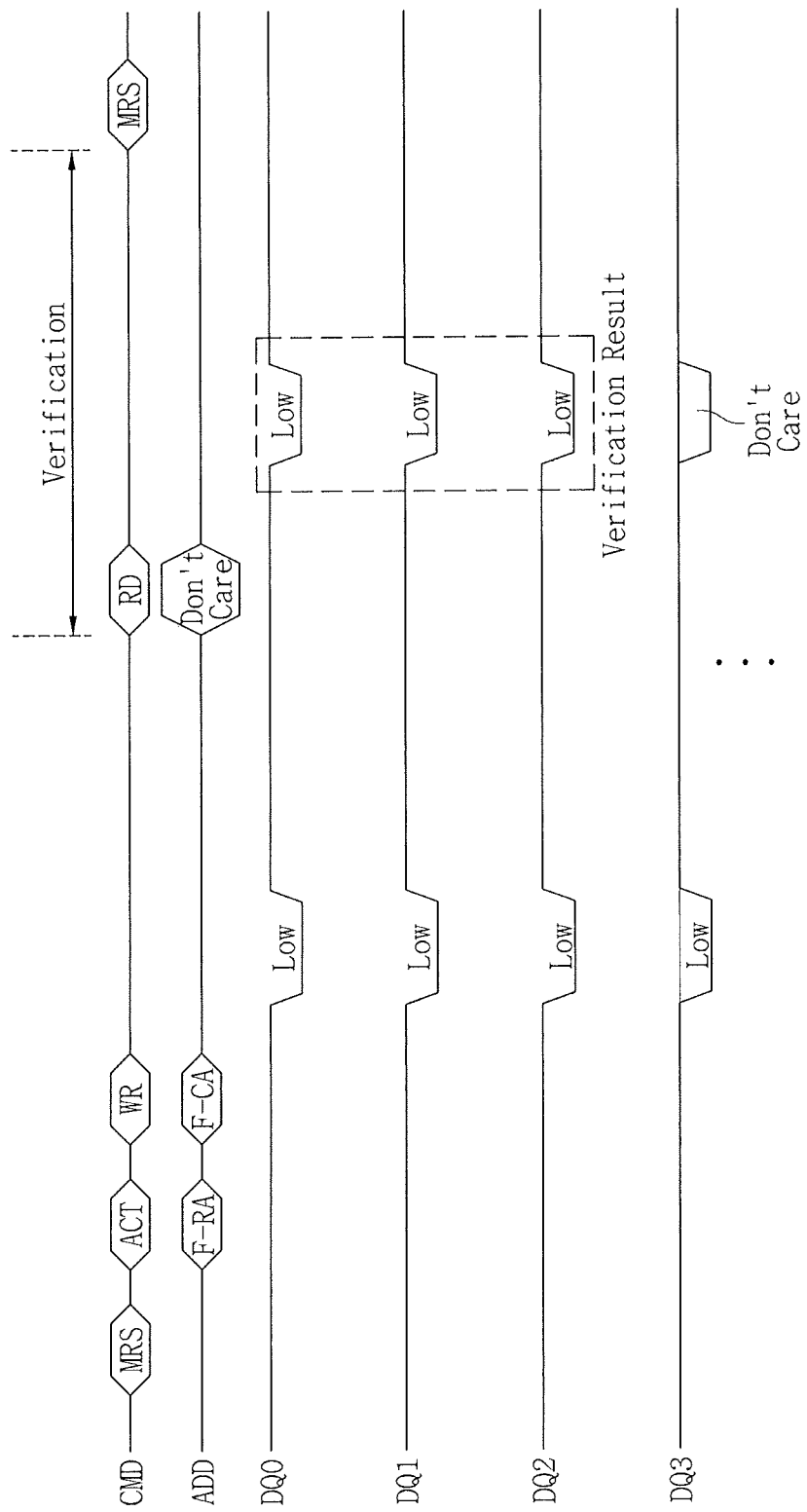
FIG. 12 is a timing diagram illustrating an exemplary embodiment of timing when a verification result is transmitted in parallel, in accordance with aspects of the inventive concept.

FIG. 12 is an embodiment of a timing diagram illustrating timing when verification results are transmitted in parallel, in accordance with aspects of the inventive concept.

Referring to the embodiment of FIG. 12, when a mode register set command MRS, an active command ACT, and a write command WR are input via a command line CMD, a row fail address F-RA and a column fail address F-CA are stored in an anti-fuse array which is a non-volatile memory device. Then, states of the stored row fail address F-RA and a column fail address F-CA are checked by reading the row fail address F-RA and a column fail address F-CA to verify them, and resultant verification result is transmitted to the test device 100 via data pins DQ0, DQ1, and DQ2. For example, the verification result that is three logic lows ('L') is transmitted in parallel via the data pins DQ0, DQ1, and DQ2. Values transmitted to the other data pins DQ3, . . . , DQ7, is not recognized by a memory controller.

FIG. 13 is a table illustrating an embodiment of verification results to be transmitted in parallel, according to aspects of the inventive concept.

Referring to the embodiment of FIG. 13, states of the verification result may be checked by reading the verification result stored in an anti-fuse array, which is a non-volatile memory. If verification result transmitted via data pins DQ0, DQ1, and DQ2 is all logic low (Case 1), this means that programming is completed normally and a fail bit is replaced with row redundant cells. If the verification result transmitted via the data pins DQ0, DQ1, and DQ2 is logic low, low, and high, respectively (Case 2), this means that programming is completed normally and a fail bit is replaced with column redundant cells. If the verification result transmitted via the data pins DQ0, DQ1, and DQ2 is logic low, high, and low, respectively (Case 3), this means that programming is completed normally and a fail bit is replaced with a single redundant cell. If the verification result transmitted via the data pins DQ0, DQ1, and DQ2 is logic low, high, and high, respectively (Case 4), this means that no specific meaning is given for future use.

Cases 5 to 8 each denote that programming is performed incompletely. If the verification result transmitted via the data pins DQ0, DQ1, and DQ2 is logic high, low, and low, respectively (Case 5), this means that a rupture process performed on a memory cell has a problem, i.e., did not complete properly. If the verification result transmitted via the data pins DQ0, DQ1, and DQ2 is logic high, low, and high, respectively (Case 6), this means that the rupture process is still in progress. In this case, verification may be temporarily delayed and then requested according to a read command RD. If the verification result transmitted via the data pins DQ0, DQ1, and DQ2 is logic high, high, and low, respectively (Case 7), this means that there is no available redundant cell. Thus, a fail bit cannot be repaired and should thus be replaced with another memory cell. If the verification result transmitted via the data pins DQ0, DQ1, and DQ2 is all logic high (Case 8), this means that a current chip is not selected. The verification result is transmitted in parallel to the test device 100 via the data pins DQ0, DQ1, and DQ2.

Figure 14:
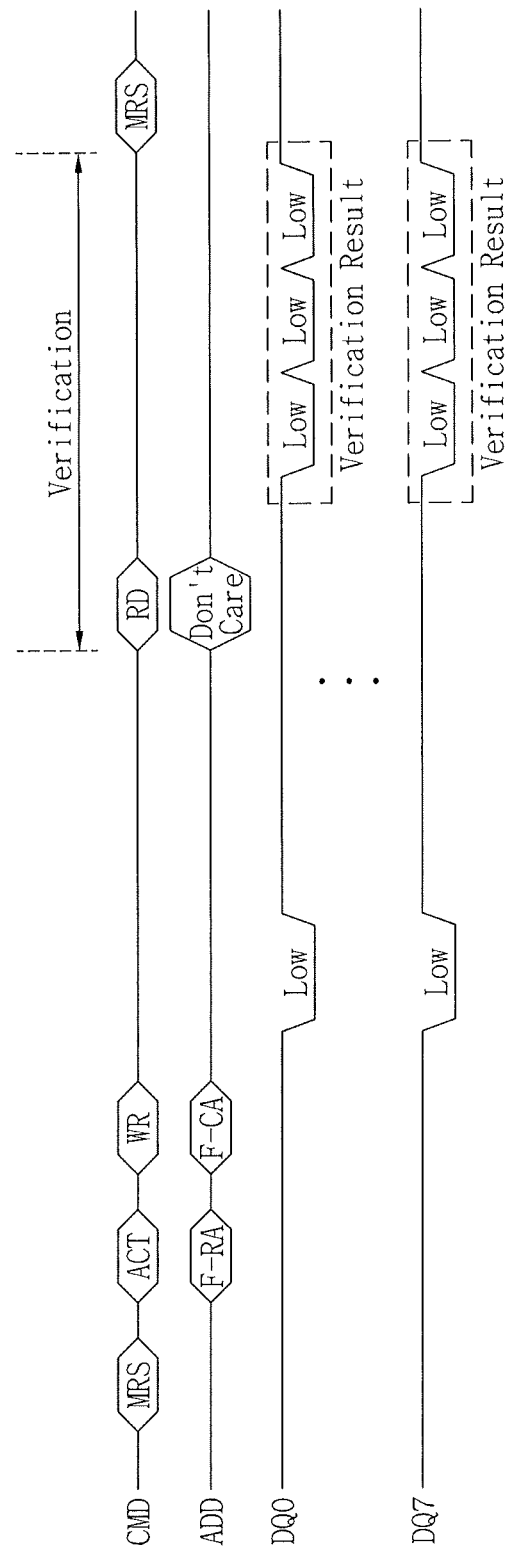
FIG. 14 is a timing diagram illustrating an exemplary embodiment of timing when verification results are transmitted, in accordance with aspects of the inventive concept.

FIG. 14 is an embodiment of a timing diagram illustrating timing when verification results are transmitted, in accordance with aspects of the inventive concept.

Referring to the embodiment of FIG. 14, the verification results illustrated in FIG. 13 are transmitted in series. For example, a 3-bit verification result is transmitted in series via a data pin DQ0. The same 3-bit verification result may be transmitted to the test device 100 via a data pin DQ7.

FIG. 15 is a table illustrating an embodiment of verification results to be transmitted in series, in accordance with aspects of the inventive concept.

Referring to FIG. 15, Case 1 (LLL) denotes that a fail bit is replaced with row redundant cells. For example, a 3-bit verification result is transmitted in series to the test device 100 via one data pin DQ. Case 6 (HLH) denotes that a rupture process is still in progress, in which a 3-bit verification result is transmitted in series to the test device 100 via data pins DQ0, DQ1, DQ2, and DQ3.

Figure 16:
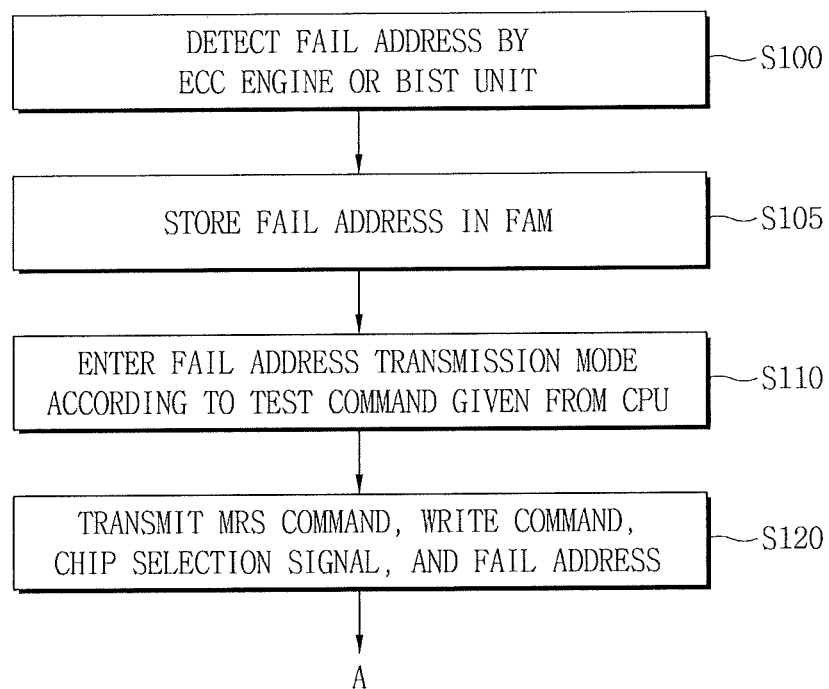
FIGS. 16 and 17 are timing charts illustrating an exemplary embodiment of a method of operating a test device, in accordance with aspects of the inventive concept.
Figure 17:
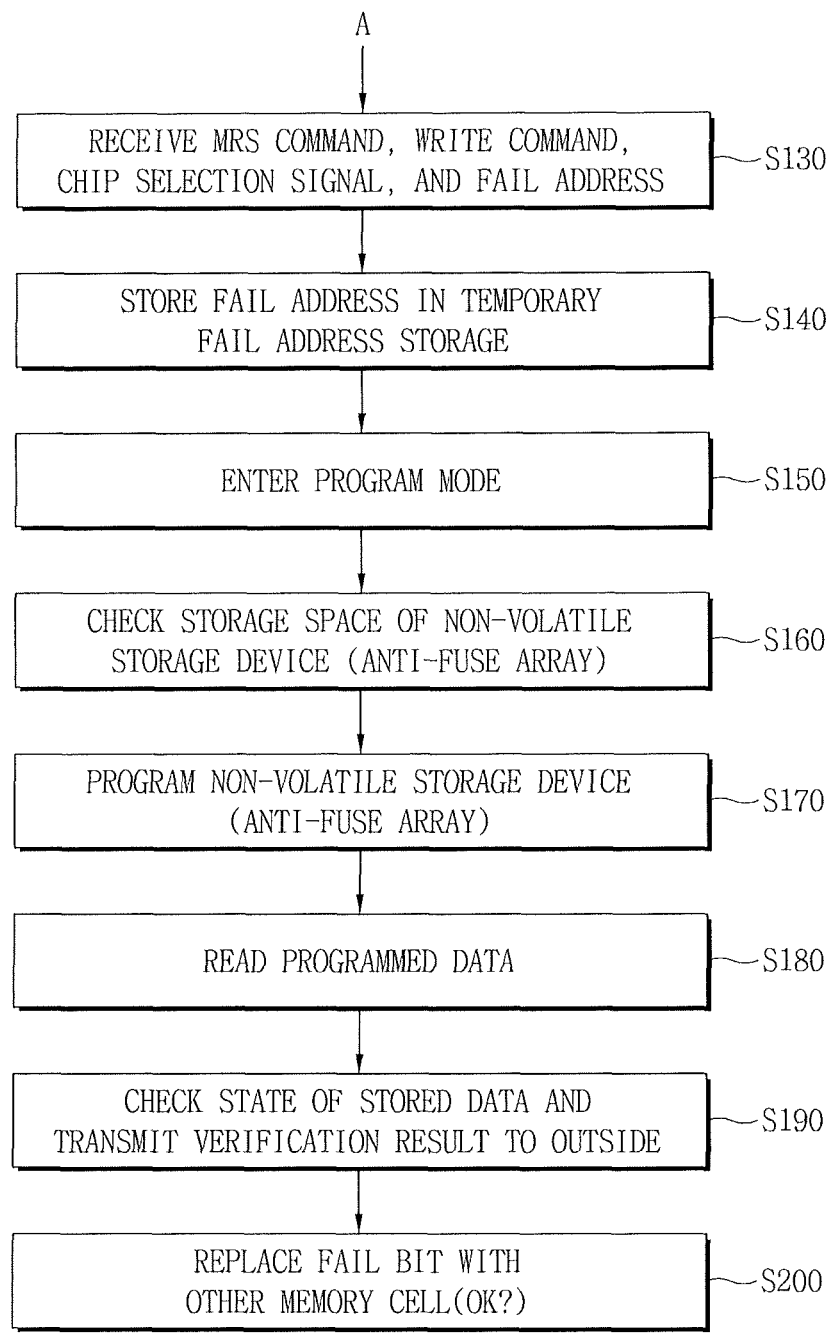

FIGS. 16 and 17 are timing charts illustrating an embodiment of a method of operating a test device, according to aspects of the inventive concept.

Referring to the embodiment of FIG. 16, a test device performs fail address detection and transmission as described below. First, a fail address is detected using an ECC engine or a BIST unit (operation S100). Then, the detected fail address is stored in a fail address memory (FAM) (operation S105). Then, a fail address transmission mode is entered according to a test command given from a CPU (operation S110). The test commands include a test start command, a test exit command, a command that instructs to start transmission of the fail address, and a command that instructs to end the transmission of the fail address. Then, a mode register set command, a chip selection signal, and the fail address are transmitted (operation S120).

Referring to the embodiment of FIG. 17, a memory device receives the mode register set command, a write command, the chip selection signal, and the fail address (operation S130). Then, the fail address is stored in a temporary fail address storage (operation S140). Then, a mode of programming a non-volatile storage device is entered (operation S150). Then, a storage space of an anti-fuse array, which is a non-volatile storage device, is checked (operation S160). Then, the anti-fuse array, which is a non-volatile storage device, is programmed (operation S170). Then, programmed data is read to verify the stored fail address (operation S180). Then, a state of the stored data is checked and a verification result is then transmitted to the outside (operation S190), i.e., external to the memory device. Finally, a fail bit is replaced with another memory cell (operation S200).

Figure 18:
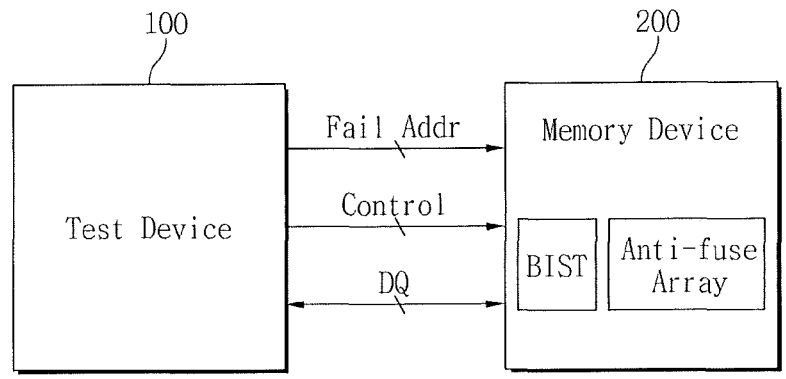
FIG. 18 is a conceptual diagram of exemplary embodiment of a memory test system, in accordance with another aspect of the inventive concept.

FIG. 18 is a conceptual diagram of another embodiment of a memory test system, in accordance with aspects of the inventive concept.

Referring to the embodiment of FIG. 18, the memory test system includes a test device 100 and a memory device 200, such as the embodiments described above. In this embodiment, the test device 100 transmits a fail address Addr, a control signal, and data DQ. The memory device 200 includes a BIST unit and an anti-fuse array, which is a non-volatile memory device. The BIST unit tests the memory device 200 according to a test command received from the test device 100, and stores the fail address in the anti-fuse array.

Figure 19:
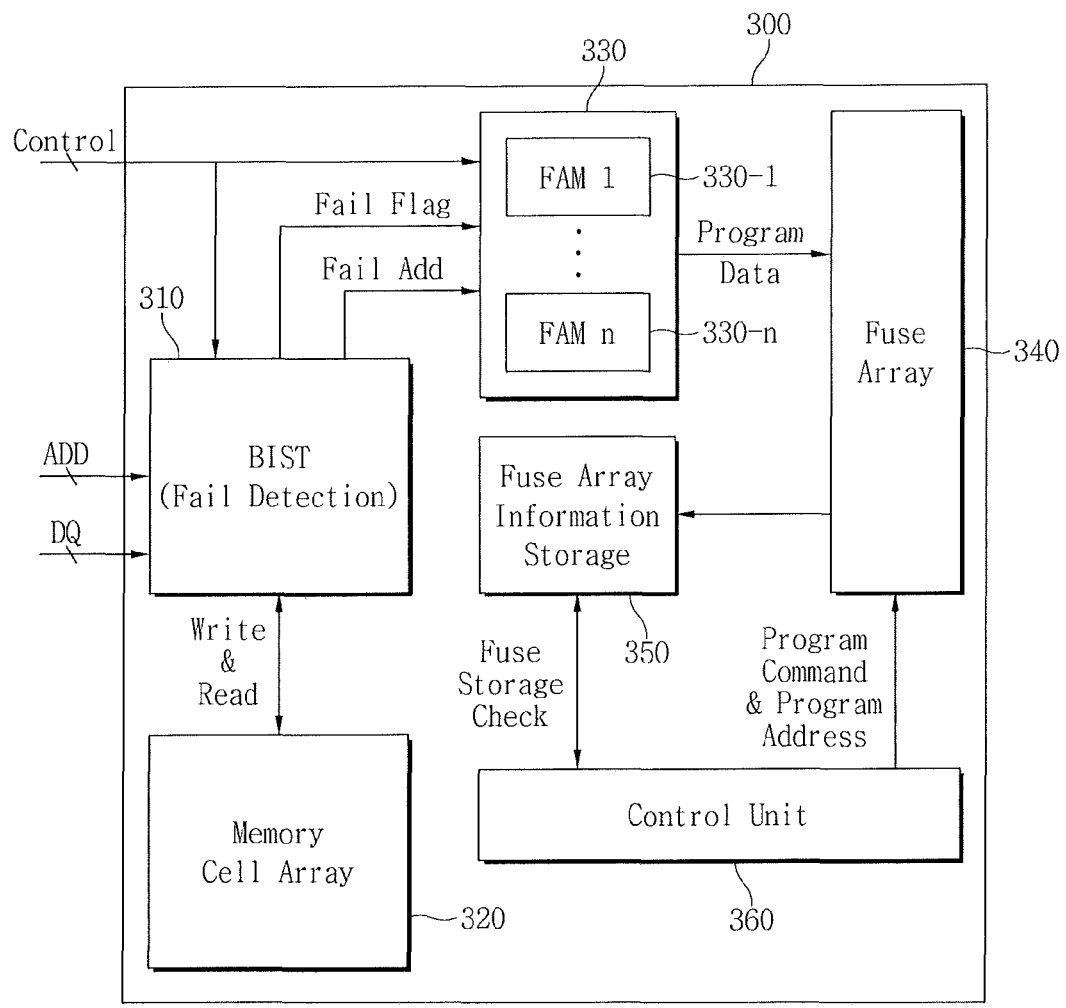
FIG. 19 illustrates a circuit block diagram of an exemplary embodiment of a memory device, in accordance with another aspect of the inventive concept.

FIG. 19 illustrates a circuit block of another embodiment of a memory device 300, in accordance with aspects of the inventive concept.

Referring to FIG. 19, the memory device 300 includes a fuse array 340, as a non-volatile memory constructed to store a fail address as program data, a temporary fail address memory (FAM) 330, a fuse array information storage 350 configured to store information about a fuse, a control unit 360 configured to control the fuse array 340 and the fuse array information storage 350, a BIST unit 310 configured to detect a fail address, and a memory cell array 320. The BIST unit 310 receives a test command Control and test data DQ from a test device 100, and detects a fail address by writing the test data DQ to the memory cell array 320 and then reading the test data DQ from the memory cell array 320. When a fail bit occurs, a fail flag and a fail address corresponding to the fail bit are transmitted to the FAM 330.

The FAM 330 may be embodied as a register including a plurality of fail address arrays FAM1, . . . , FAMn, in various embodiments. The control unit 360 may check a space of the fuse array 340 using the fuse array information storage 350, to determine if there are available fuses in the fuse array. The control unit 360 may also control a program command and a program address to be stored in the fuse array 340. The test command can be supplied to the test device according to the control signal, and the BIST unit 310 is thus activated. Also, the fail address stored in the FAM 330 is transmitted to the fuse array 340 according to the control signal.

Figure 20:
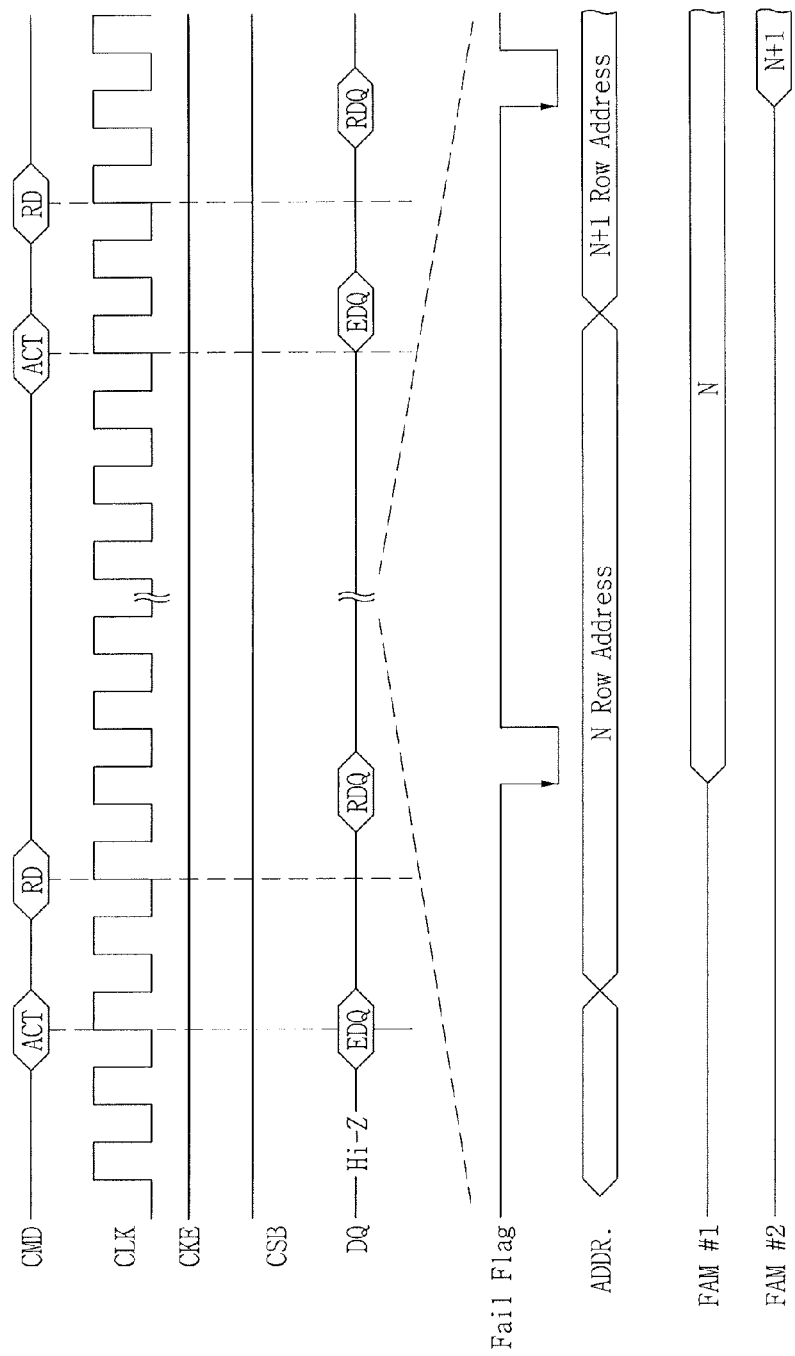
FIGS. 20 and 21 are timing diagrams illustrating an exemplary embodiment of an operation of a memory device, in accordance with aspects of the inventive concept.
Figure 21:
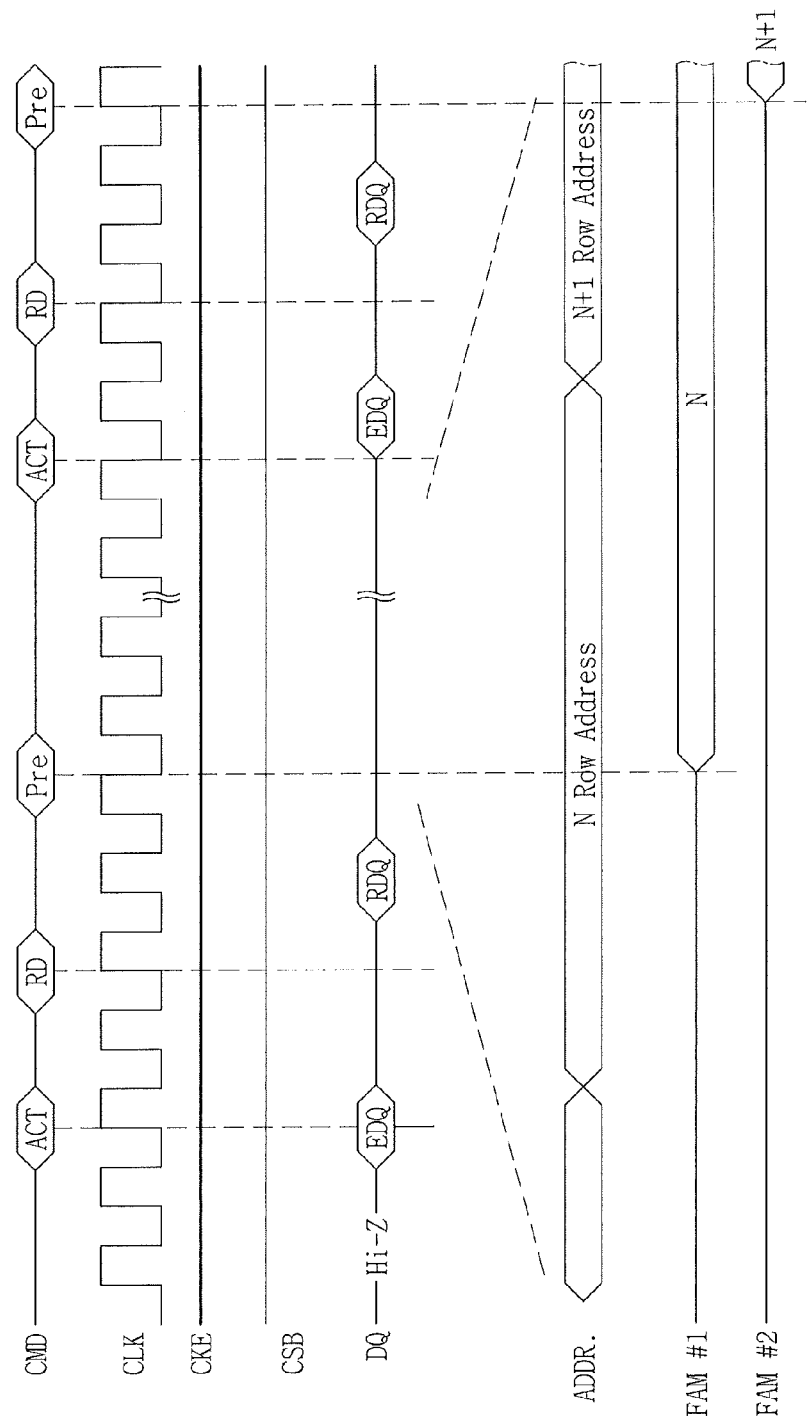

FIGS. 20 and 21 are embodiment of timing diagrams illustrating an operation of a memory device, in accordance with aspects of the inventive concept.

Referring to the embodiment of FIG. 20, an active command ACT and a read command RD are input via a command line CMD. Test data EDQ is input via a data pin DQ. The test data EDQ is written to a memory cell array, and read data RDQ is generated by reading the test data EDQ stored in the memory cell array according to the read command RD. When a fail flag signal changes from logic high to logic low, an $N^{th}$ row address is written to a fail address memory FAM #1. When the fail flag occurs again, an $(N+1)^{th}$ row address is written to a fail address memory FAM #2. Such a command and data are input in synchronization with a clock signal CLK, and a clock enable signal CKE and a chip selection signal are also input in synchronization with the clock signal CLK.

Referring to the embodiment of FIG. 21, an active command ACT, a read command RD, and a pre-charge command Pre are input via a command line CMD. The timing diagram of FIG. 21 is substantially similar to that of FIG. 20, except that an $N^{th}$ row address is transmitted to a fail address memory FAM #1 when the pre-charge command Pre is input, and an $(N+1)^{th}$ row address is transmitted to a fail address memory FAM #2 when the pre-charge command Pre is input again. The FAM 330 of FIG. 19 may be embodied as a register, an SRAM, or the like, as examples.

Figure 22:
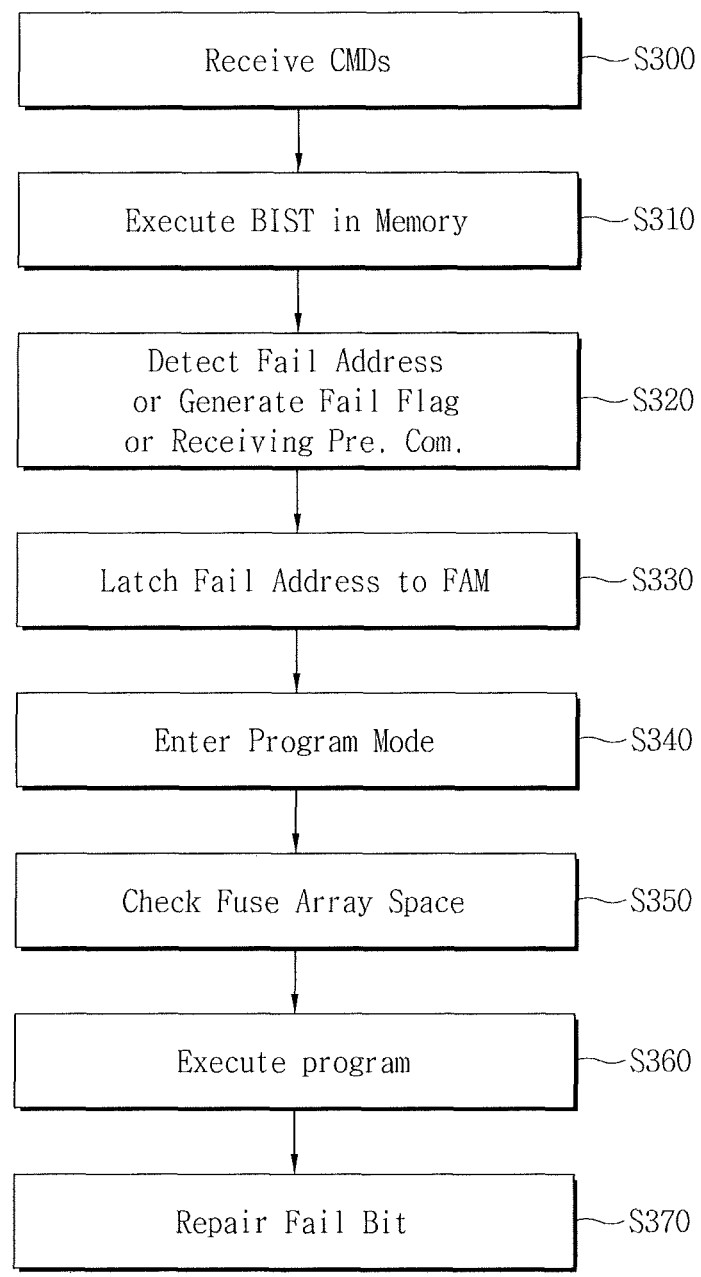
FIG. 22 is a flowchart illustrating an exemplary embodiment of a method of operating a memory device, according to aspects of the inventive concept.

FIG. 22 is a flowchart illustrating an embodiment of a method of operating a memory device, according to aspects of the inventive concept.

Referring to the embodiment of FIG. 22, the memory device receives an active command, a write command, and a read command from a test device (operation S300). Then, a BIST unit of the memory device is activated according to a command (operation S310). Then, a fail address is detected, a fail flag is generated, or a pre-charge command is received (operation S320). Then, the fail address is stored in a fail address memory according to the fail flag or the pre-charge command (operation S330). Then, a fuse array enters a program mode for programming the fail address (operation S340). Then, the capacity of a fuse memory is checked to determine the availability of fuses (operation S350). Then, the fuse array is programmed (operation S360). Thereafter, a fail bit is repaired (operation S370) by using the fuse array to program a redundant cell, in place of the memory cell having the fail bit.

Figure 23:
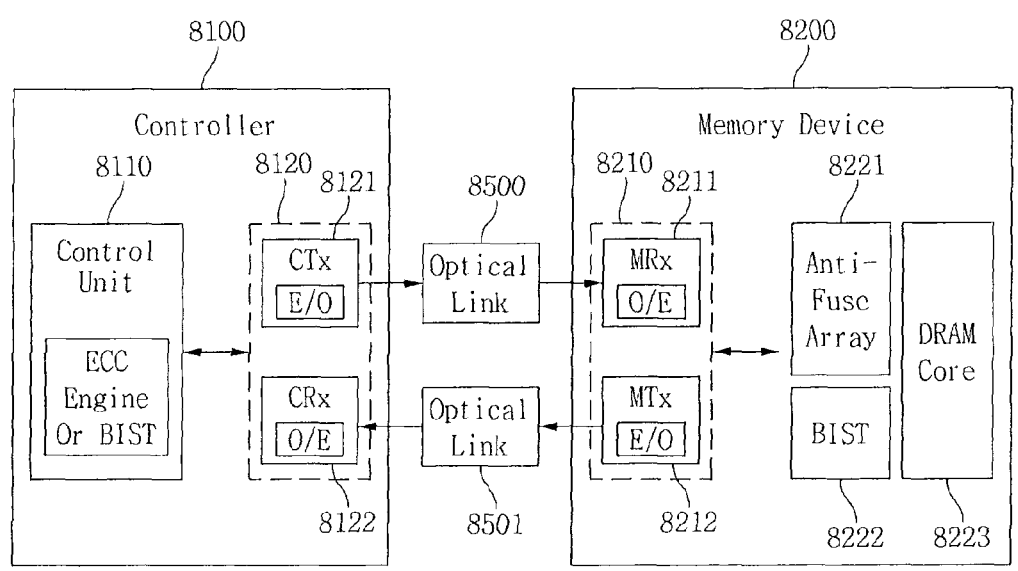
FIG. 23 is a diagram illustrating an exemplary embodiment of optical links of a memory test system, in accordance with aspects of the inventive concept.

FIG. 23 is a diagram illustrating an embodiment of a memory system having optical links, in accordance with aspects of the inventive concept.

Referring to the embodiment of FIG. 23, the memory test system includes a controller 8100 and a memory device 8200. The controller 8100 includes a control unit 8110, a controller transmitter 8121, and a controller receiver 8122. The control unit 8110 includes at least one of an ECC engine and a BIST unit. The controller transmitter 8121 includes an electrical-to-optical (E/O) interface circuit that converts an electrical signal into an optical signal. The controller receiver 8122 includes an optical-to-electrical (O/E) interface circuit that converts an optical signal into an electrical signal. The memory device 8200 includes an anti-fuse array 8221, which is a non-volatile storage device, a BIST unit 8222, a DRAM core 8223, a transmitter 8312, and a receiver 8211, in this embodiment. The transmitter 8312 includes an E/O interface unit that converts an electrical signal into an optical signal. The receiver 8211 includes an O/E interface unit that converts an optical signal into an electrical signal. The controller 8100 and the memory device 8200 are connected via a first optical link 8500 and a second optical link 8501 to transmit and receive data. In another exemplary embodiment of the inventive concept, data may be transmitted and received via one optical link, rather than plural optical links. An I/O circuit 8120 of the controller 8100 and an I/O circuit 8210 of the memory device 8200 are connected via the first optical link 8500 and the second optical link 8501.

Figure 24:
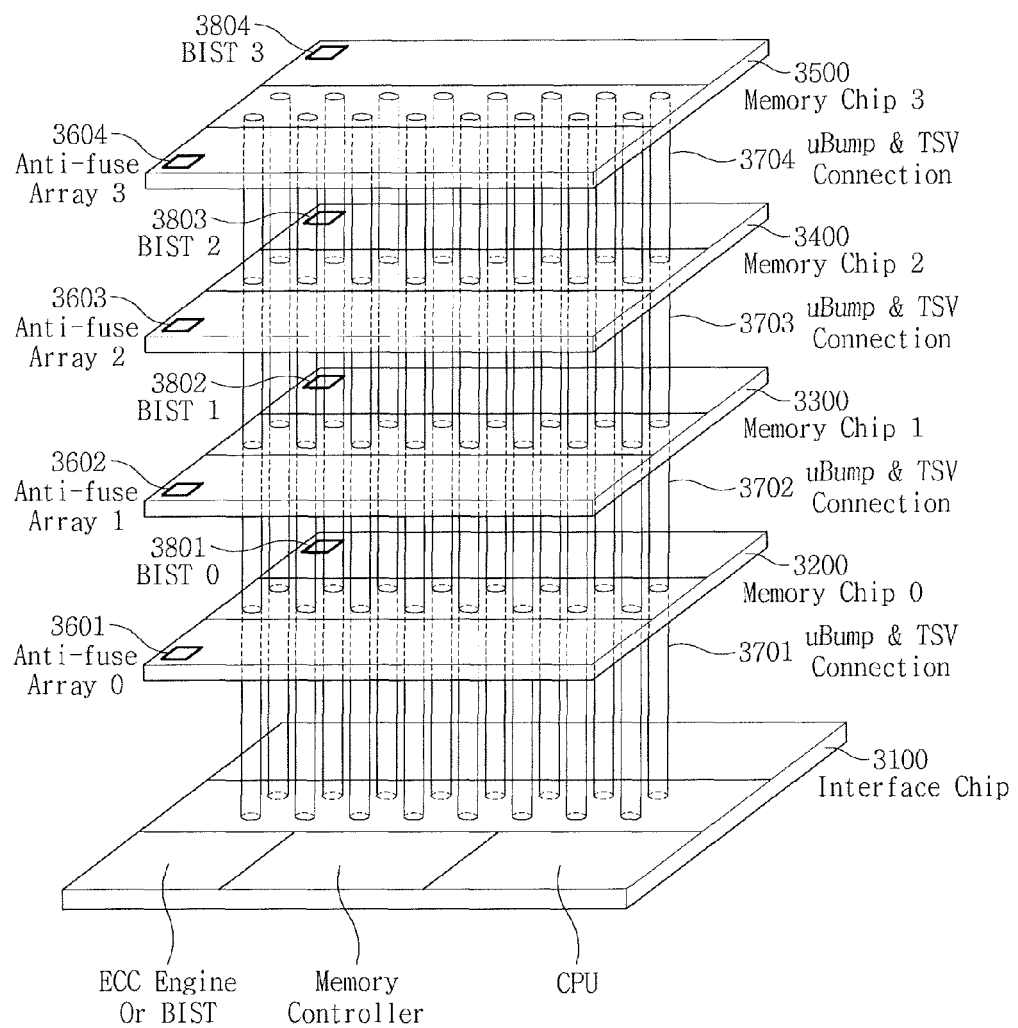
FIG. 24 illustrates an exemplary embodiment of through-silicon-via (TSV) stacked chips to which a memory test system is applied, in accordance with aspects of the inventive concept.

FIG. 24 illustrates an embodiment having through-silicon-via (TSV) stacked chips to which a memory test system is applied, in accordance with aspects of the inventive concept.

Referring to the embodiment of FIG. 24, an interface chip 3100 is disposed as a lowermost layer, and memory chips 3200, 3300, 3400, and 3500 are sequentially disposed on the interface chip 3100. The interface chip 3100 may include a memory controller 2400, at least one of ECC engine and a BIST unit 2410, and a CPU 2420. The memory chips 3200, 3300, 3400, and 3500 each include anti-fuse arrays 3601, 3602, 3603, and 3604, which are non-volatile storage devices, and BIST units 3801, 3802, 3803, and 3804, respectively. A fail address of a memory chip is detected using a test device (not shown) of the interface chip 3100 and is stored in an anti-fuse array of the memory chip. These chips are connected via micro-bump (uBumps) and TSV formed therein (3701, 3702, 3703, and 3704). For example, the number of stacked chip(s) disposed on the interface chip 3100 may be one or more.

Figure 25:
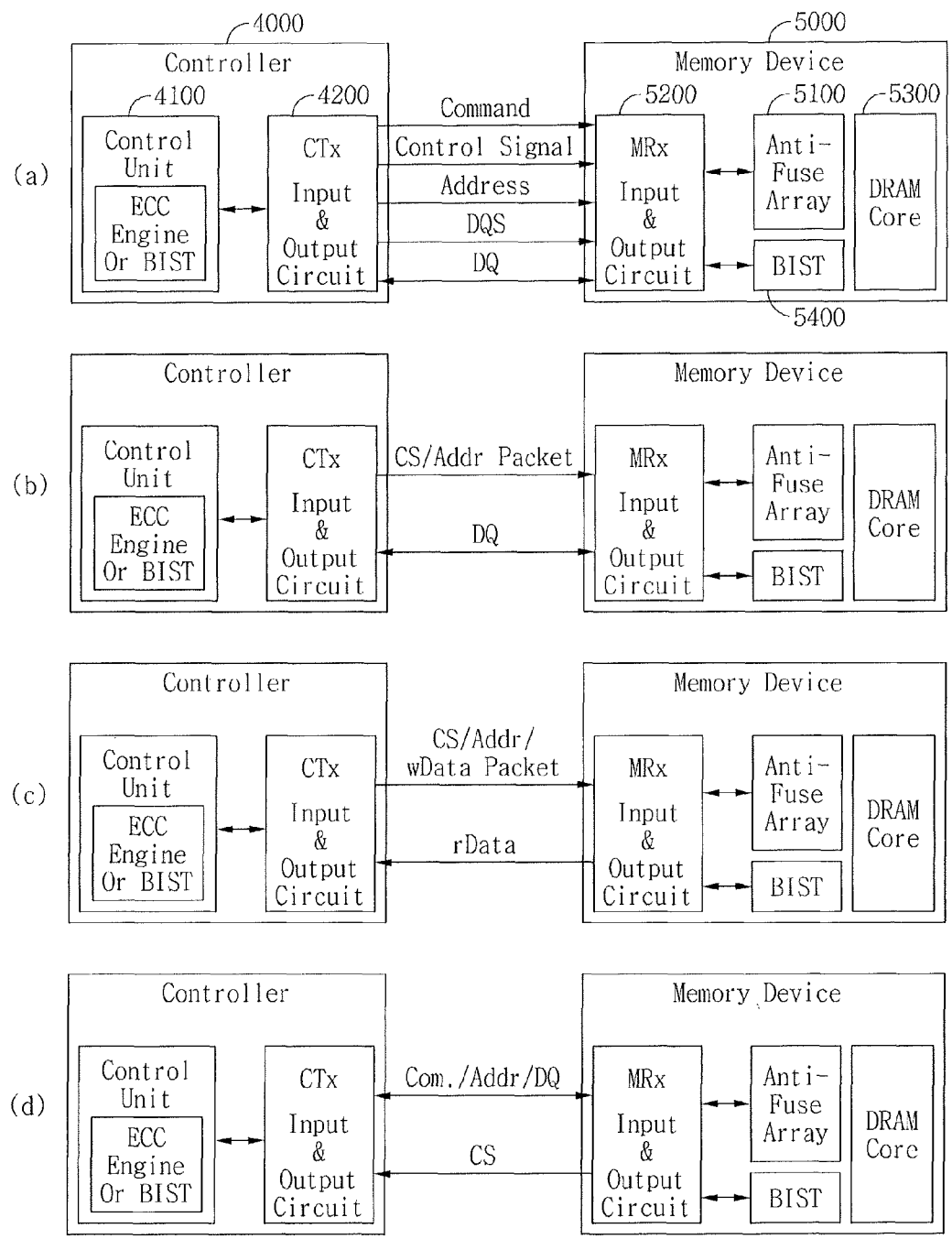
FIG. 25 illustrates an exemplary embodiment of various interfaces of a memory test system, in accordance with aspects of the inventive concept.

FIGS. 25(*a*) through 25(*d*) illustrate embodiments of various interfaces of a memory test system, in accordance with aspects of the inventive concept.

Referring to the embodiment of FIG. 25(*a*), a memory system includes a controller 4000 and a memory device 5000, with at least one communication link disposed between the two. The controller 4000 includes a control unit 4100 and an I/O circuit 4200. The control unit 4100 may include at least one of an ECC engine and a BIST unit. The memory device 5000 includes a memory (e.g., DRAM) core 5300, an anti-fuse array 5100, which is a non-volatile storage device, a BIST unit 5400, and an I/O circuit 5200. The I/O circuit 4200 of the controller 4000 includes an interface via which a command, a control signal, an address, and a data strobe DQS are transmitted to the memory device 5000 and data DQ is transmitted to and received from the memory device 5000. A fail address is also transmitted via the interface.

Referring to the embodiment of FIG. 25(*b*), an I/O circuit 4200 of a controller 4000 includes an interface via which a chip selection signal CS and an address are transmitted to a memory device 5000 using one packet and data DQ is transmitted to and received from the memory device 5000, i.e., data DQ not part of the packet. A fail address is also transmitted via the interface.

Referring to the embodiment of FIG. 25(*c*), an I/O circuit 4200 of a controller 4000 includes an interface via which a chip selection signal CS, an address, and write data wData are transmitted to a memory device 5000 using one packet and read data rData is received from the memory device 5000, i.e., rData is separately transmitted. A fail address is also transmitted via the interface.

Referring to the embodiment of FIG. 25(*d*), an I/O circuit 4200 of a controller 4000 includes an interface via which a command, an address, and data DQ are transmitted to and received from a memory device 5000 and a chip selection signal CS is received from the memory device 5000, i.e., chip selection signal CS is separately transmitted. A fail address is also transmitted via the interface.

Figure 26:
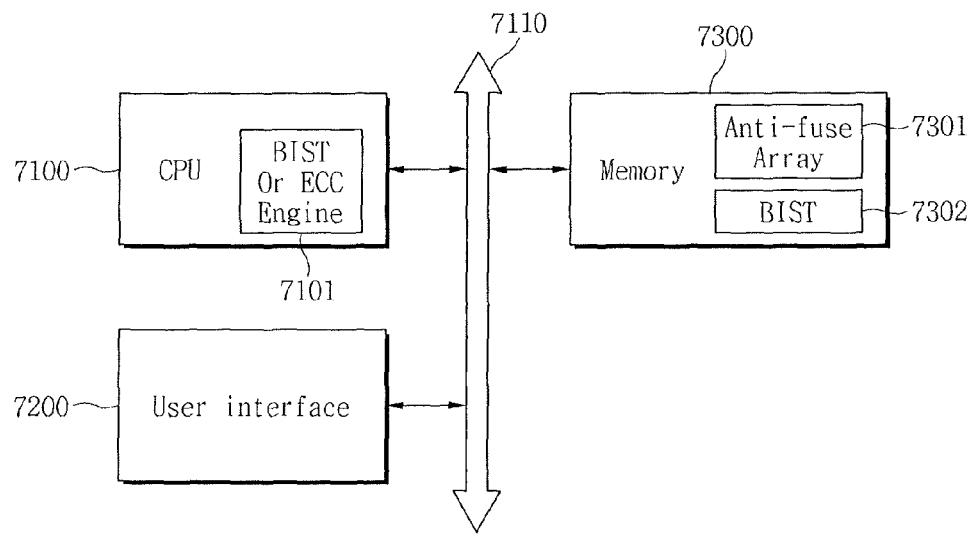
FIGS. 26 and 27 are diagrams illustrating an exemplary embodiment of system connections of a memory test system, in accordance with aspects of the inventive concept.
Figure 27:
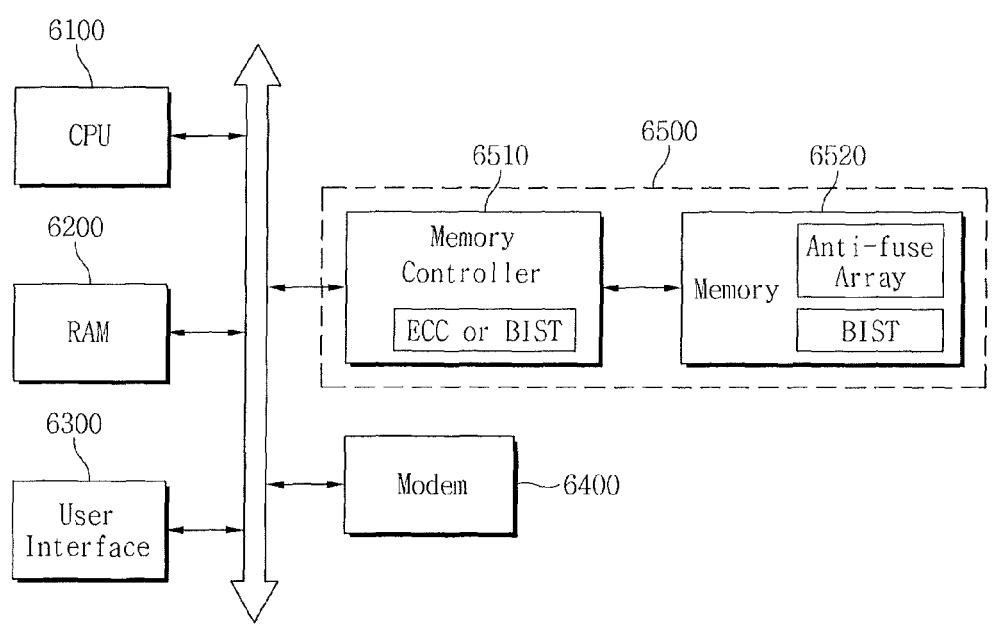

FIGS. 26 and 27 are diagrams illustrating embodiments of system connections of a memory test system, in accordance with aspects of the inventive concept.

Referring to the embodiment of FIG. 26, provided is a memory 7300 that includes an anti-fuse array 7301, which is a non-volatile memory, and a BIST unit 7302, a CPU 7100 that includes a BIST unit and/or an ECC engine 7101, and a user interface 7200. The foregoing are connected via a system bus 7110.

Referring to FIG. 27, a memory system 6500 that includes a memory 6520 having an anti-fuse array and a BIST unit, and a memory controller 6510 including a BIST and/or ECC engine, a CPU 6100, a random access memory (RAM) 6200, a user interface 6300, and a modem 6400 are connected via a system bus 6110.

Figure 28:
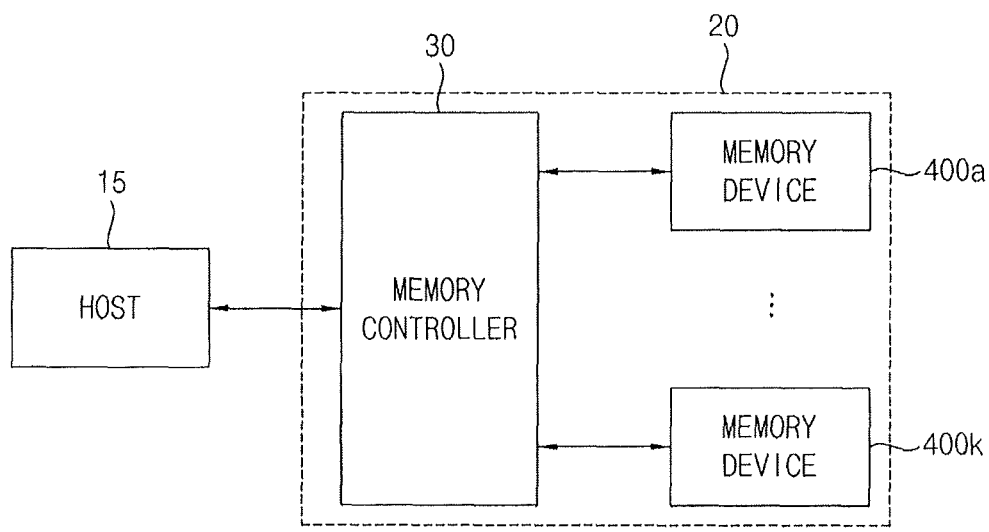
FIG. 28 is a block diagram illustrating an electronic system according to exemplary embodiments.

FIG. 28 is a block diagram illustrating an example embodiment of an electronic system in accordance with principles of inventive concepts.

Referring to FIG. 28, electronic system 10 may include a host 150 and a memory system 20. The memory system 20 may include a memory controller 30 and a plurality of semiconductor memory devices 400*a*-400*k*.

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS), for example. In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE), for example.

The memory controller 30 may control overall operation of the memory system 20. The memory controller 30 may control overall data exchange between the host 15 and the plurality of semiconductor memory devices 400a~400k. For example, the memory controller 30 may write data in the plurality of semiconductor memory devices 400a~400k or read data from the plurality of semiconductor memory devices 400a~400k in response to a request from the host 15.

In addition, the memory controller 30 may issue operation commands to the plurality of semiconductor memory devices 400a~400k for controlling the plurality of semiconductor memory devices 400a~400k.

In some embodiments, each of the plurality of semiconductor memory devices 400a~400k may be a phase change random access memory (PRAM), a resistive random access memory (RRAM), a magnetic random access memory (MRAM) or a ferroelectric random access memory (FRAM), each including a plurality of resistive type memory cells. In some embodiments, each of the plurality of semiconductor memory devices 400a~400k may be dynamic random access memory (DRAM) including a plurality of dynamic memory cells.

An MRAM is a nonvolatile computer memory based on magnetoresistance. An MRAM is different from a volatile RAM in many aspects. Because an MRAM is nonvolatile, the MRAM may retain all stored data even when power is turned off.

Although a nonvolatile RAM may be generally slower than a volatile RAM, an MRAM has read and write response times comparable with read and write response times of a volatile RAM. Unlike a conventional RAM that stores data as electric charge, an MRAM stores data by using magnetoresistance elements. In general, a magnetoresistance element is made of two magnetic layers each having magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which, when a spin-polarized current flows in one direction, a magnetization direction of the magnetic layer is changed due to the spin transfer of electrons. A magnetization direction of one magnetic layer (pinned layer) may be fixed and a magnetization direction of the other magnetic layer (free layer) may vary according to a magnetic field generated by a program current.

The magnetic field of the program current may arrange the magnetization directions of the two magnetic layers in parallel or anti-parallel. In an example embodiment, if the magnetization directions of the two magnetic layers are parallel, a resistance between the two magnetic layers is in a low ("0") state, and if the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbances. The program current (also referred to herein as a programming current) applied to switch the high and low states of the resistance between the magnetic layers of the MRAM is typically high. Accordingly, when a plurality of cells are arranged in an MRAM array, a program current applied to one memory cell may change a magnetic field of a free layer of an adjacent cell. Such a write disturbance may be prevented by using an STT phenomenon. A typical STT-MRAM may include a magnetic tunnel junction (MTJ), which is a magnetoresistive data storage device including two magnetic layers (a pinned layer and a free layer) and an insulating layer disposed between the two magnetic layers.

In such devices, a program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, as a result, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling, as a cell size is reduced and the program current is reduced, and prevents the write disturbance. In addition, the STT-MRAM may have a high tunnel magnetoresistance ratio, and improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 29:
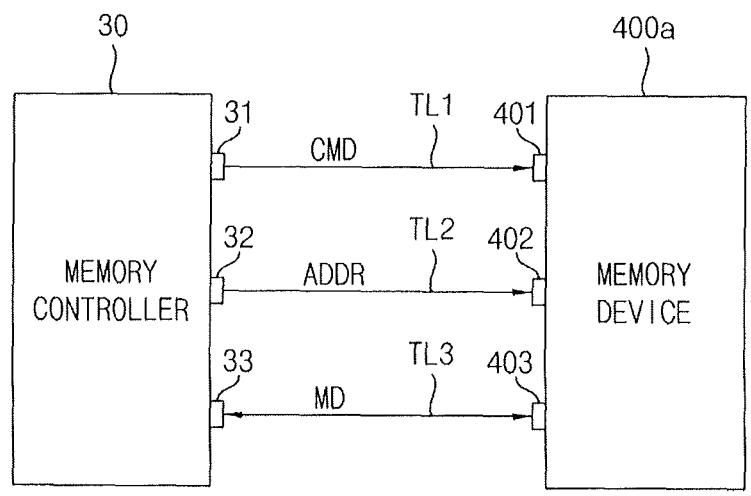
FIG. 29 is a block diagram illustrating an example of the memory system in FIG. 28 according to exemplary embodiments.

FIG. 29 is a block diagram illustrating an example of the memory system in FIG. 28 according to exemplary embodiments.

In FIG. 29, only one semiconductor memory device 400a in communication with the memory controller 30 is illustrated for convenience. However, the details discussed herein related to semiconductor memory device 400a may equally apply to the other semiconductor memory devices 400b~400k.

Referring to FIG. 29, the memory system 20 may include the memory controller 30 and the semiconductor memory device 400a. Each of the memory controller 30 and the semiconductor memory device 400a may be formed as a separate semiconductor chip or as a separate group of chips (e.g., semiconductor memory device 400a may a stack of semiconductor chips in a semiconductor package), for example. The memory controller 300 and the semiconductor memory device 400a may be connected to each other through corresponding command pins 31 and 401, corresponding address pins 32 and 402 and corresponding data pins 43 and 403, for example. The command pins 31 and 401 may transmit a command signal CMD through a command transmission line TL1, the address pins 32 and 402 may transmit an address signal ADDR through an address transmission line TL2, and the data pins 33 and 403 may exchange data MD through a data transmission line TL3.

Referring to FIGS. 28 and 29, the memory controller 30 may input data to the semiconductor memory device 400a or may output data from the semiconductor memory device 400a through the data pins 33 and 403 based on the request from the host 15. In addition, the semiconductor memory device 400a may receive address from the memory controller 30 through the address pins 32 and 402.

Figure 30A:
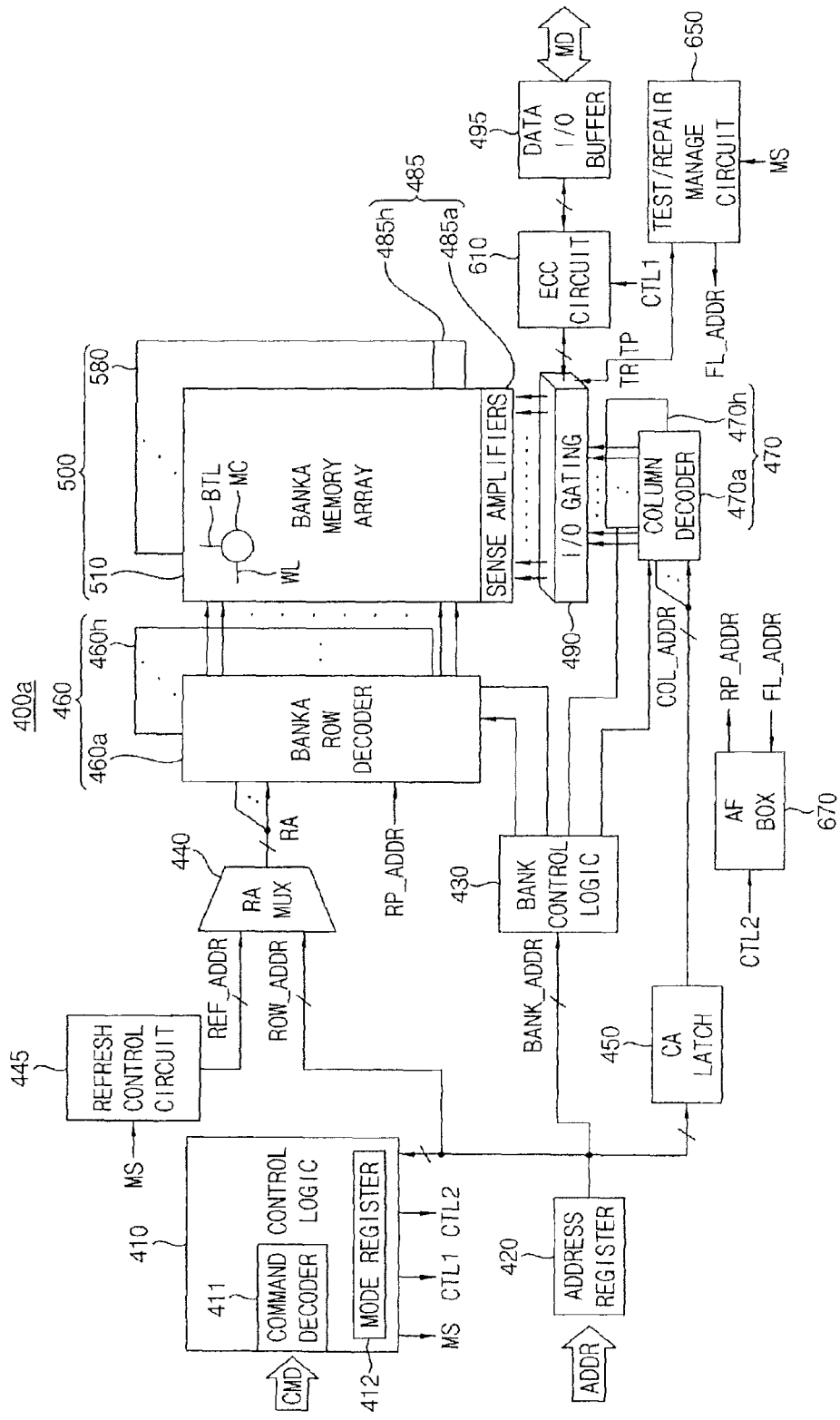
FIG. 30A is a block diagram illustrating an example of the semiconductor memory device in FIG. 29 according to exemplary embodiments.

FIG. 30A is a block diagram illustrating an example embodiment of a memory device such as the semiconductor memory device in FIG. 29 in accordance with principles of inventive concepts.

Referring to FIG. 30A, the semiconductor memory device 400a may include a control logic circuit 410, an address register 420, a bank control logic 430, a row address multiplexer 440, a column address latch 450, a row decoder 460, a column decoder 470, a memory cell array 500, a sense amplifier unit 585, an input/output (I/O) gating circuit 590, a data input/output (I/O) buffer 495, a refresh control circuit 445, an error correction circuit 610, a test/repair manage circuit 650 and an anti-fuse box 670.

The memory cell array 500 may include first through eighth bank arrays 510~540. The row decoder 460 may include first through eighth bank row decoders 460a~460h respectively coupled to the first through eighth bank arrays 510~580, the column decoder 470 may include first through eighth bank column decoders 470a~470h respectively coupled to the first through eighth bank arrays 510~580, and the sense amplifier unit 485 may include first through eighth bank sense amplifiers 485a~485h respectively coupled to the first through eighth bank arrays 510~580. The first through eighth bank arrays 510~580, the first through eighth bank row decoders 460a~460h, the first through eighth bank column decoders 470a~470h and first through eighth bank sense amplifiers 485a-485h may form first through eighth banks. Although the semiconductor memory device 400a is illustrated in FIG. 30A as including eight banks, the semiconductor memory device 400a is not limited thereto and may include any number of banks.

The address register 420 may receive an address ADDR including a bank address BANK_ADDR, a row address ROW_ADDR and a column address COL_ADDR from the memory controller 30. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the first through eighth bank row decoders 460a~460h corresponding to the bank address BANK_ADDR may be activated in response to the bank control signals, and one of the first through eighth bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh control circuit 445. The row address multiplexer 440 may selectively output the row address ROW_ADDR or the refresh row address REF_ADDR as a row address RA. The row address RA that is output from the row address multiplexer 440 may be applied to the first through eighth bank row decoders 460a~460h.

The activated one of the first through eighth bank row decoders 460a~460h may decode the row address RA that is output from the row address multiplexer 440 or a repair address RP_ADDR, and may activate a word-line corresponding to the row address RA or the repair address RP_ADDR. For example, the activated bank row decoder may apply a word-line driving voltage to the word-line corresponding to the row address RA or the repair address RP_ADDR.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR (that is, increment without receiving an additional column address). The column address latch 450 may apply the temporarily stored or generated column address to the first through eighth bank column decoders 470a~470h.

The activated one of the first through eighth bank column decoders 470a~470h may decode the column address COL_ADDR that is output from the column address latch 450, and may control the input/output gating circuit 290 in order to output data corresponding to the column address COL_ADDR.

The I/O gating circuit 490 may include a circuitry for gating input/output data. The I/O gating circuit 490 may further include read data latches for storing data that is output from the first through eighth bank arrays 510~580, and write drivers for writing data to the first through eighth bank arrays 510~580.

Data MD to be read from one bank array of the first through eighth bank arrays 510~580 may be sensed by a sense amplifier coupled to the bank array from which the data is to be read, and may be stored in the read data latches. The data MD stored in the read data latches may be provided to the memory controller 30 via the data I/O buffer 495. Data MD to be written in one bank array of the first through eighth bank arrays 510~580 may be provided to the data I/O buffer 495 from the memory controller 30. The write driver may write the data MD in one bank array of the first through eighth bank arrays 510~580.

The control logic circuit 410 may control operations of the semiconductor memory device 400a. For example, the control logic circuit 410 may generate control signals for the semiconductor memory device 400a in order to perform a write operation or a read operation. The control logic circuit 410 may include a command decoder 411 that decodes a command CMD received from the memory controller 30 and a mode register 412 that sets an operation mode of the semiconductor memory device 400a.

For example, the command decoder 411 may generate the control signals corresponding to the command CMD by decoding a write enable signal (/WE), a row address strobe signal (/RAS), a column address strobe signal (/CAS), a chip select signal (/CS), etc. The control logic circuit 210 may generate a mode signal MS indicating an operation mode of the semiconductor memory device 400a, may generate a first control signal CTL1 to control the error correction circuit 610, and may generate a second control signal CTL2 to control the anti-fuse box 670 by decoding the command MD. The control logic circuit 410 may provide the mode signal MS to the refresh control circuit 445 and the test/repair manage circuit 650.

The test/repair manage circuit 650 may be enabled in response to the mode signal MS indicating a test mode of the semiconductor memory device 400a. When the test/repair manage circuit 650 is enabled, the test/repair manage circuit 650 may test memory cells in a first region of the memory cell array 500 by providing a test pattern TP to the memory cells in the first region of the memory cell array 500 and receiving test result signal TR corresponding to the test pattern TP through the I/O gating circuit 490. The test/repair manage circuit 650 may identify, or detect, one or more failed cells in the first region based on the test result signal TR, may determine a fail address FL_ADDR corresponding to the detected one or more failed cells and may store the fail address FL_ADDR in a second region, different from the first region, in the memory cell array 500.

The test/repair manage circuit 650 performs the test on the memory cells in the first region on a word-line basis, and may program the fail address FL_ADDR of a word-line in the anti-fuse box 670 when the word-line corresponds to the fail address FL_ADDR.

The anti-fuse box 670 may output the repair address RP_ADDR corresponding to the fail address FL_ADDR when the fail address FL_ADDR is input to the anti-fuse box 670 during a read operation or a write operation of the semiconductor memory device 400a. The repair address RP_ADDR may designate, or identify the location of, redundancy cells that replace the detected failed cells, for example. The semiconductor memory device 400a may perform the write/read operation on the redundancy cells in response to the repair address RP_ADDR from the anti-fuse box 670. In this manner, the failed cells may be replaced with redundancy cells.

The semiconductor memory device 400a may store fail addresses consecutively in the second region of the memory cell array 500 before programming the fail addresses in the an-fuse box 670 during testing the memory cells. As a result, the semiconductor memory device 400a does not require an extra memory that stores the fail address during the test operation, and the semiconductor memory device 400a may decrease an occupied area.

The refresh control circuit 445 may refresh the first region and the second memory region of the memory cell array 500 with different refresh periods in response to the mode signal MS indicating the test mode. For example, when a plurality of test items are not associated with a refresh period of the semiconductor memory device 400a in the test mode, the refresh control circuit 445 may refresh memory cells in the first region of the memory cell array 500 with a first refresh period longer than a standard refresh period defined in a specification of the semiconductor memory device 400a and may refresh the memory cells in the second region of the memory cell array 500 with a second refresh period equal to or shorter than the standard refresh period. When the test operation is performed on the semiconductor memory device 400a for one of the test items associated with the refresh period of the semiconductor memory device 400a, the refresh control circuit 445 may refresh the memory cells in the first region of the memory cell array 500 with a refresh period required by the test item associated with a refresh period of the semiconductor memory device 400a.

Therefore, the first region and the second region of the memory cell array 500 may provide a different reliability.

Figure 30B:
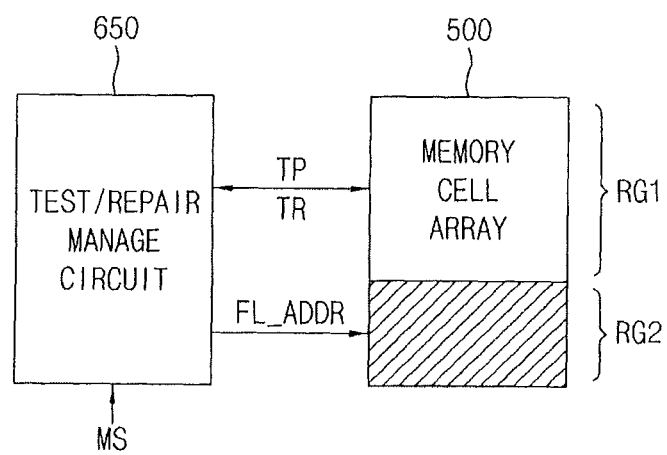
FIG. 30B illustrates the memory cell array and the test/repair manage circuit in the semiconductor memory device of 30A.

FIG. 30B illustrates the memory cell array and the test/repair manage circuit in the semiconductor memory device of 30A.

Referring to FIG. 30B, the memory cell array 500 may include a first region RG1 and a second region RG2.

When the mode signal MS indicates the test mode, the test/repair manage circuit 650 may write the test pattern TP in the memory cells in the first region RG1, may receive the test result signal TR corresponding to the test pattern TP, may detect one or more failed cells of the memory cells in the first region RG1 based on the test result signal TR, may determine the fail address FL_ADDR corresponding to the detected, or identified, one or more failed cells, and may store the fail address FL_ADDR in the second region RG2.

The test/repair manage circuit 650 may test the memory cells in the first region for a plurality of test items on a word-line basis, may detect failed cells by accumulating the test result signal TR for the test items, may determine the fail address FL_ADDR corresponding to the detected failed cells and may store the fail address FL_ADDR in the second region RG2. The test/repair manage circuit 650 may store the fail address FL_ADDR in the second region RG2 in a form of a look-up table, for example.

Referring to FIGS. 30A and 30B, when the test/repair manage circuit 650 stores the fail address FL_ADDR in the second region RG2, the fail address FL_ADDR may be encoded by the error correction circuit 610 and the test/repair manage circuit 650 may store the encoded fail address FL_ADDR in the second region RG2 redundantly. The test/repair manage circuit 650 may perform a majority voting on the fail address FL_ADDR redundantly stored in the second region RG2, select a fail address indicating, or corresponding to, a majority vote, decode the selected fail address FL_ADDR by the error correction circuit 610, and program the decoded fail address FL_ADDR in the anti-fuse box 470.

In some embodiments, the first region RG1 may be a portion of one bank array and the second region RG2 may be a portion of another, different, bank array. In some embodiments, the first region RG1 and the second region RG2 may be different memory regions that do not share a bit-line sense amplifier in one bank array. In some embodiments, the first region RG1 may be a portion of one bank array and the second region RG2 may be portions of other bank arrays.

When the mode signal MS indicates the test mode, the refresh control circuit 445 may refresh memory cells in the first region RG1 with a first refresh period longer than a standard refresh period, which may be a nominal period defined, for example, in a specification of the semiconductor memory device 400a and may refresh the memory cells in the second region RG2 with a second refresh period equal to or shorter than the standard refresh period. Therefore, the first region RG1 and the second RG2 of the memory cell array 500 may provide different reliability in the test mode.

The error correction circuit 610 may perform an error correction code (ECC) encoding and ECC decoding on the main data MD in a normal mode of the semiconductor memory device 400a. The error correction circuit 610 may perform an encoding operation and a decoding operation on the fail address FL_ADDR in response to the control signal CTL1 in the test mode.

The test/repair manage circuit 650 may test the memory cells in the second region RG1 after the test on the memory cells in the first region RG1 is completed.

The test/repair manage circuit 650 is a circuit for detecting, or identifying, failed cells and repairing failed cells in the memory cell array 500. In some embodiments, the test/repair manage circuit 650 may include a built-in self test (BIST) circuit and a built-in self repair (BISR) circuit. The BIST circuit may test the memory cells in the memory cell array 500 and the BISR circuit may perform a self-repair operation based on test result of the BIST circuit.

The test/repair manage circuit 650 may select a memory location of the second region RG in which the fail address is stored, in the memory cell array 500. The test/repair manage circuit 650 may select the second region RG2 based on a predetermined address, or may select the second region RG2 based on a test pattern provided to the memory cell array 500, for example.

FIGS. 31A to 31E are circuit diagrams of example embodiments of a memory cell, such as the memory cell shown in FIG. 30A, in accordance with principles of inventive concepts.

Figure 31A:
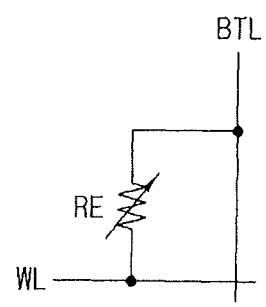
FIGS. 31A to 31E are circuit diagrams of examples of the memory cell shown in FIG. 30A, according to exemplary embodiments.
Figure 31B:
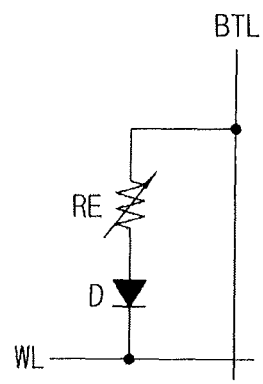
Figure 31C:
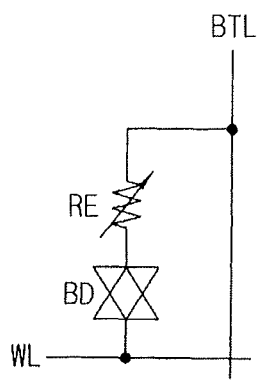
Figure 31D:
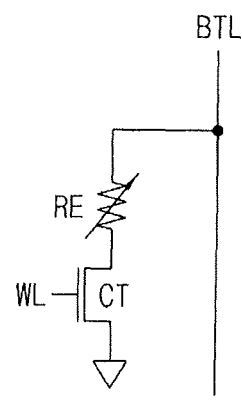
Figure 31E:
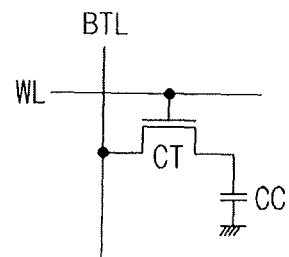

FIGS. 31A to 31D illustrate memory cells MC that are implemented with resistive type memory cells and FIG. 31E illustrates a memory cell MC which is implemented with a dynamic memory cell.

FIG. 31A illustrates a resistive type memory cell without a selection element, while FIGS. 31B to 31D show resistive type memory cells, each comprising a selection element.

Referring to FIG. 31A, a memory cell MC may include a resistive element RE connected to a bit-line BTL and a word-line WL. Such a resistive memory cell having a structure without a selection element may store data by a voltage applied between bit-line BL and word-line WL.

Referring to FIG. 31B, a memory cell MC may include a resistive element RE and a diode D. The resistive element RE may include a resistive material for data storage. The diode D may operate as a selection element (or switching element) that supplies current to resistive element RE or cuts off the current supply to resistive element RE according to a bias of word-line WL and bit-line BTL. The diode D may be coupled between the resistive element RE and word-line WL, and the resistive element RE may be coupled between the bit-line BTL and the diode D. Positions of the diode D and the resistive element RE may be interchangeable in example embodiments. The diode D may be turned on or turned off by a word-line voltage. Thus, a resistive memory cell may be not driven where a voltage of a constant level or higher is supplied to an unselected word-line WL.

Referring to FIG. 31C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BTL and bidirectional diode BD. Positions of the bidirectional diode. BD and the resistive element RE may be interchangeable. The bidirectional diode BD may block leakage current flowing to an unselected semiconductor memory cell.

Referring to FIG. 31D, a memory cell MC may include a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BTL and the transistor CT. Positions of the transistor CT and the resistive element RE may be interchangeable. The semiconductor memory cell may be selected or unselected depending on whether the transistor CT drive by word-line WL is turned on or turned off.

Referring to FIG. 31E, a memory cell MC may include a cell capacitor CC and a transistor CT. The transistor CT may be a selection element (or switching element) that connects/ disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage (not illustrated).

Figure 32:
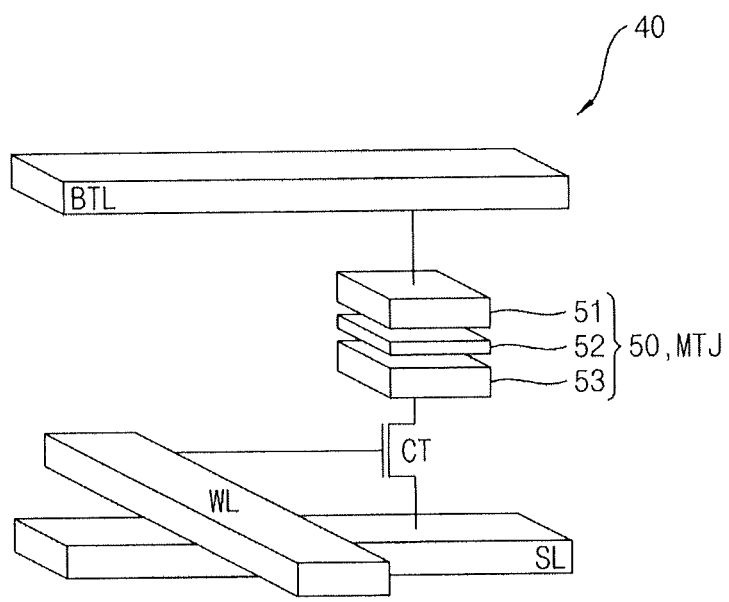
FIG. 32 illustrates an example of the memory cell (referred to as STT-MRAM cell) shown in FIG. 30A, according to exemplary embodiments.

FIG. 32 illustrates an example embodiment of a memory cell such as the memory cell (referred to as STT-MRAM cell) shown in FIG. 30A, in accordance with principles of inventive concepts.

Referring to FIG. 32, an STT-MRAM cell 40 may include a MTJ element 50 and a cell transistor CT. A gate of the cell transistor CT is connected to a word-line WL and one electrode, which may be referred to herein as a first electrode, of the cell transistor CT is connected through the MTJ element 50 to a bit-line BTL. Also, the other electrode, which may be referred to herein as a second electrode, of the cell transistor CT is connected to a source line SL.

The MTJ element 50 may include the free layer 51, the pinned layer 53, and a tunnel layer 52 disposed between the free layer 51 and the pinned layer 53. A magnetization direction of the pinned layer 43 may be fixed, and a magnetization direction of the free layer 51 may be parallel to or anti-parallel to the magnetization direction of the pinned layer 53 according to written data. In order to fix the magnetization direction of the pinned layer 53, for example, an anti-ferromagnetic layer (not shown) may be further provided.

In order to perform a write operation of the STT-MRAM cell 40, a logic high voltage is applied to the word-line WL to turn on the cell transistor CT. A program current, for example, a write current, is applied to the bit-line BL and the source line SL. A direction of the write current is determined by a logic state of the MTJ element 50.

In order to perform a read operation of the STT-MRAM cell 40, a logic high voltage is applied to the word-line WL to turn on the cell transistor CT, and a read current is supplied to the bit-line BL and the source line SL. Accordingly, a voltage is developed at both ends of the MTJ element 50, is detected by the sense amplifier 485a, and is compared with a reference voltage from a reference voltage to determine a logic state of the MTJ element 40. Accordingly, data stored in the MTJ element 50 may be detected.

Figure 33:
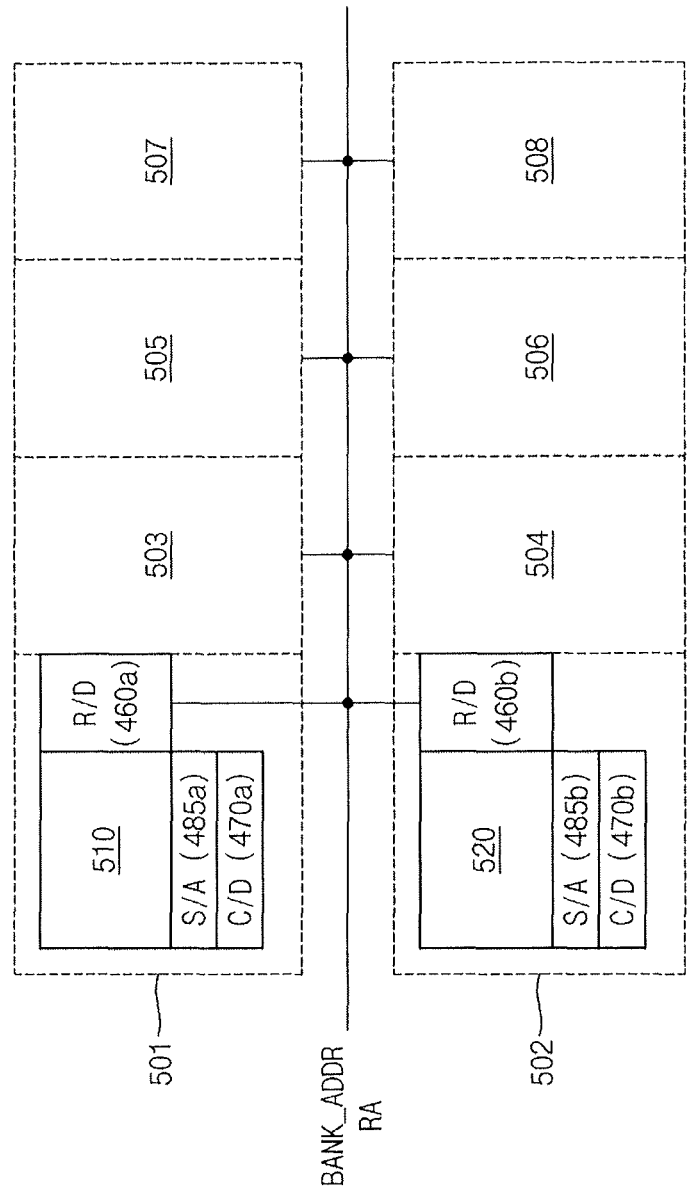
FIG. 33 is a block diagram illustrating an example of the semiconductor memory device of FIG. 30A according to exemplary embodiments.

FIG. 33 is a block diagram illustrating an example of a semiconductor memory device such as that of FIG. 30A in accordance with principles of inventive concepts.

Referring to FIG. 33, the semiconductor memory device 400a may include a plurality of banks 501~508 in each of which a plurality of memory cells are arranged in columns and rows. Each of the plurality of banks 501~508 may include a plurality of word-lines, a plurality of bit-lines, and a plurality of memory cells disposed near intersections between the word-lines and the bit-lines.

The first bank 501 may include the first bank array 510, the row decoder 460a, the sense amplifier 485a and the column decoder 470a. The second bank 502 may include the second bank array 520, the row decoder 460b, the sense amplifier 485b and the column decoder 470b. Each configuration of the third through eighth bank 503~508 may be substantially the same as or similar to each configuration of the first bank 501 and the second bank 502. The row decoder 460a may receive the bank address BANK_ADDR and the row address RA. The column decoder 470a may receive the column address (not shown). One of the plurality of banks 501~508 may be selected in response to the bank address BANK_ADDR, and memory cells in the selected bank may be accessed in response to the row address RA and the column address.

Figure 34A:
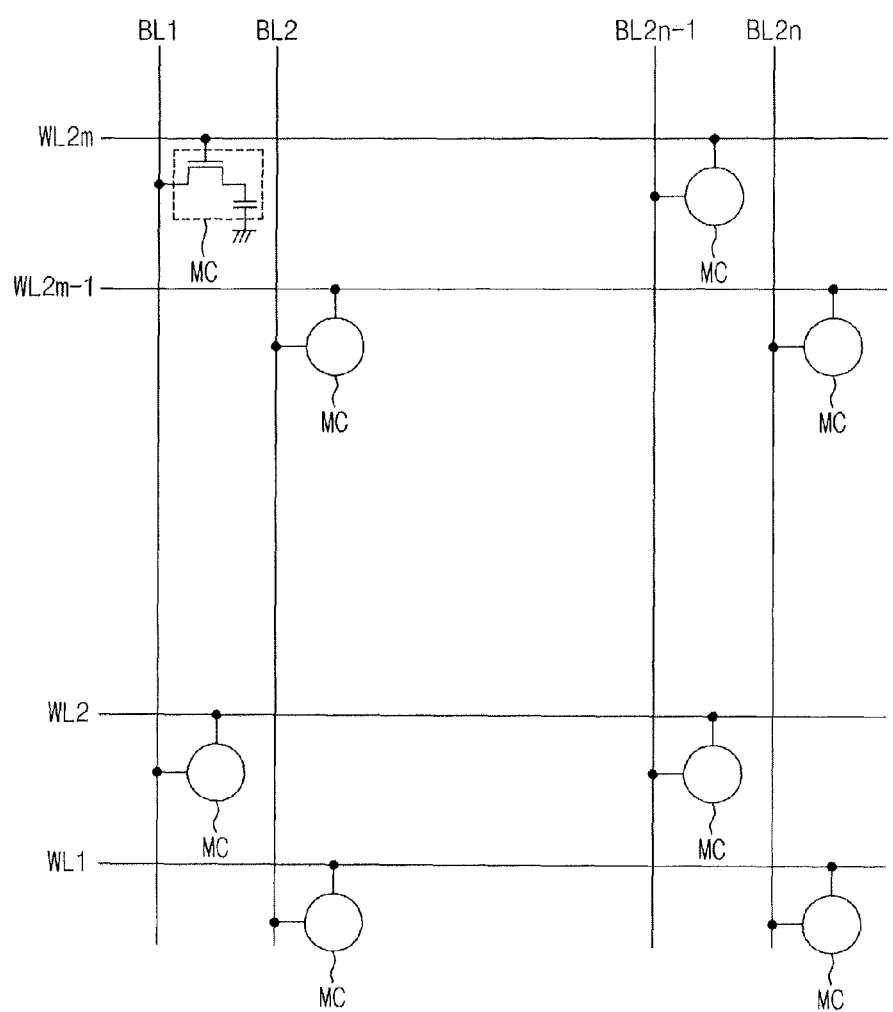
FIG. 34A illustrates an example of the first bank array in the semiconductor memory device of FIGS. 30A and 33.

FIG. 34A illustrates an example of the first bank array in the semiconductor memory device of FIGS. 30A and 33 in accordance with principles of inventive concepts.

Referring to FIG. 34A, the first bank array 510 a plurality of word-lines WL1~WL2m (m is a natural number greater than two), a plurality of bit-lines BL1~BLn (n is a natural number greater than two), and a plurality of memory cells MCs disposed near intersections between the word-lines WL1~WL2m and the bit-lines BL1~BLn. In an example embodiment, each of the plurality of memory cells MCs may include a dynamic random access memory (DRAM) cell structure. The plurality of word-lines WL1~WL2m to which the plurality of memory cells MCs are connected may be defined as rows of the first bank array 510 and the plurality of bit-lines BL1~BLn to which the plurality of memory cells MCs are connected may be defined as columns of the first bank array 510.

Figure 34B:
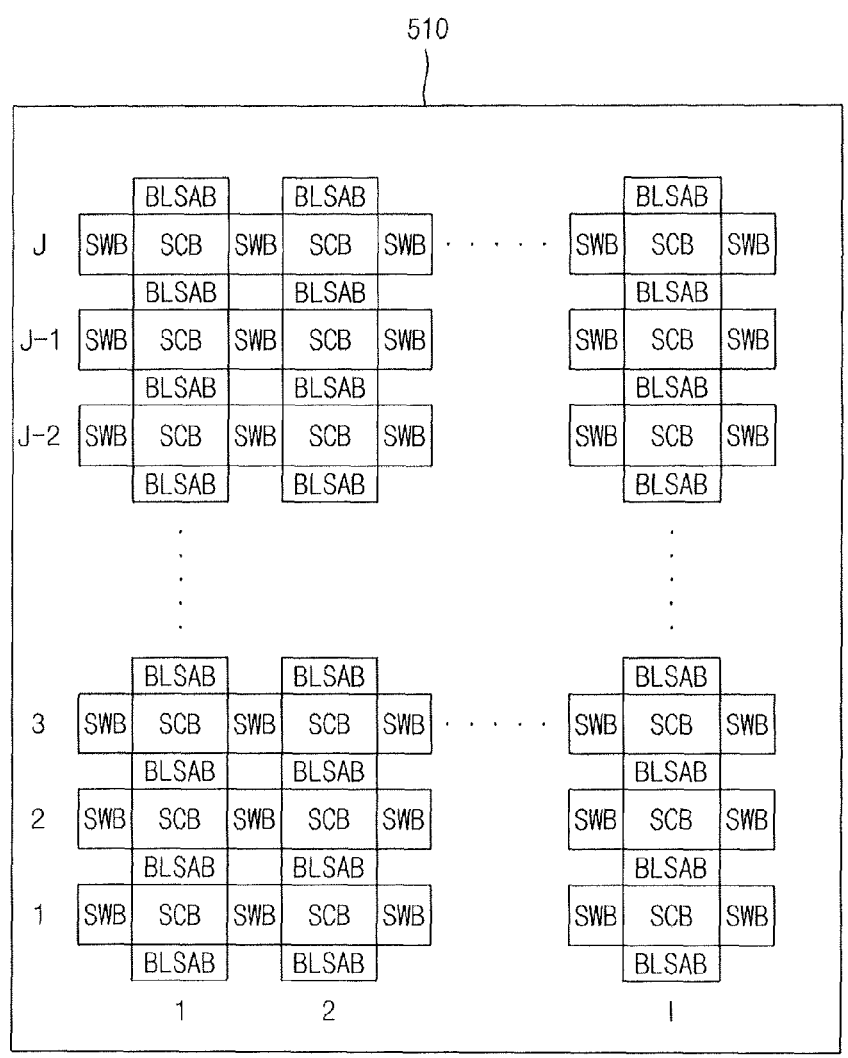
FIG. 34B illustrates an arrangement of the of the first bank array in FIG. 34A.

FIG. 34B illustrates an example arrangement of the of the first bank array in FIG. 34A.

Referring to FIG. 34B, in the first bank array 510, I sub-array blocks SCB may be disposed in a first direction D1, and J-sub array blocks SCB may be disposed in a second direction D2 orthogonal to the first direction D1. A plurality of bit-lines, a plurality of word-lines, and a plurality of memory cells may be disposed in each of the sub-array blocks SCB. The plurality of memory cells may be disposed at intersections between the bit-lines and the word-lines.

I+1 sub word-line driver regions SWB may be disposed between the sub array blocks SCB in the first direction D1. Sub word-line drivers may be disposed in the sub word-line driver regions SWB.

J+1 bit-line sense amplifier regions BLSAB may be disposed between the sub array blocks SCB in the second direction D2. Bit-line sense amplifiers, which sense data stored in the memory cells, may be disposed in the bit-line sense amplifier regions BLSAB.

When the first region RG1 and the second region RG2 belong to the same bank array, the first region RG1 and the second region RG2 may be sub array blocks SCB that do not share the 1 sub word-line driver region SWB.

Figure 35:
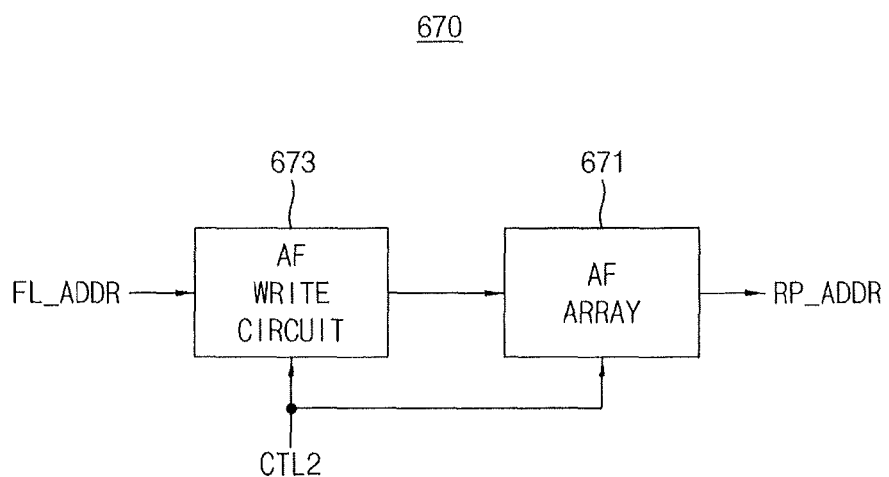
FIG. 35 is a block diagram illustrating the anti-fuse box in the semiconductor memory device of FIG. 30A.

FIG. 35 is a block diagram illustrating an example embodiment of the anti-fuse box in the semiconductor memory device of FIG. 30A.

Referring to FIG. 35, the anti-fuse box 670 includes an array of anti-fuses 671 and an anti-fuse write circuit 673.

The anti-fuse array 671 is a nonvolatile memory for storing the fail address FL_ADDR. The anti-fuse array 671 provides the repair address RP_ADDR to the row decoder 460 based on the stored fail address FL_ADDR, which is determined in response to the control signal CTL2 from the control logic circuit 410. If the fail address is input when a write or read operation is performed, a word-line connected to the redundancy cell array is selected instead of a word-line corresponding to the fail address by the repair address RP_ADDR.

The anti-fuse write circuit 673 is a write circuit for programming the anti-fuse array 671. The anti-fuse write circuit 673 programs the fail address FL_ADDR into the anti-fuse array 671 in response to the control signal CTL2 from the control logic circuit 410. The anti-fuse write circuit 673 may electrically cut (or "open"), or alternatively, short, a fuse corresponding to a word-line being connected with a memory cell judged to be a failed cell among fuses included in the anti-fuse array 671 in response to the control signal CTL2.

Figure 36:
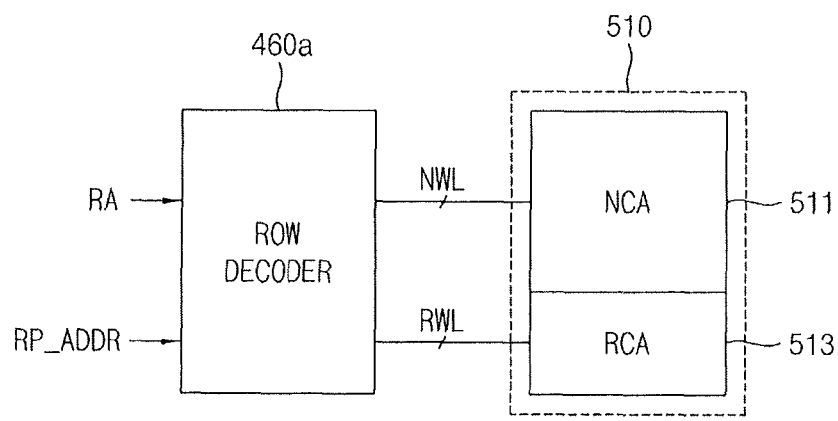
FIG. 36 illustrates the first row decoder and the first bank array in the semiconductor memory device of FIG. 30A.

FIG. 36 illustrates the first row decoder and the first bank array in the semiconductor memory device of FIG. 30A.

Referring to FIG. 36, the first bank array 510 includes a normal cell array 511 and a redundancy cell array 513.

The normal cell array 511 includes a plurality of normal cells that store data. The normal cells in the normal cell array 511 are coupled to the first row decoder 460a through a normal word-line NWL. The redundancy cell array 513 includes a plurality of redundancy cells for replacing failed cells in the normal cell array 511. The redundancy cells may have the same constitution and operation principle as the normal cells, so as to substitute for failed cells in a manner that doesn't detract from memory operation. The redundancy cells are connected to the first row decoder through a redundancy word-line RWL.

In FIG. 36, the semiconductor memory device 400a is illustrated which replaces a normal word-line with a redundancy word-line to replace failed cells of the normal cell array 511 (the normal word line is replaced with a redundancy word line in the sense that both word lines are there, but one is used in place of the other in the case of a memory cell failure). However, in some embodiments, the semiconductor memory device 400a is not limited to this configuration. For example, to replace failed cells, the semiconductor memory device 400a may be configured to replace a column line of the normal cell array 511 with a column line of the redundancy cell array 513.

The first row decoder 460a decodes a row address RA to select a part of word-lines of the first bank array 510. The first row decoder 460 selects a part of the normal word-line NWL and the redundancy word line RWL using the decoded row address RA and a repair address RP_ADDR provided from the anti-fuse box 670.

Figure 37A:
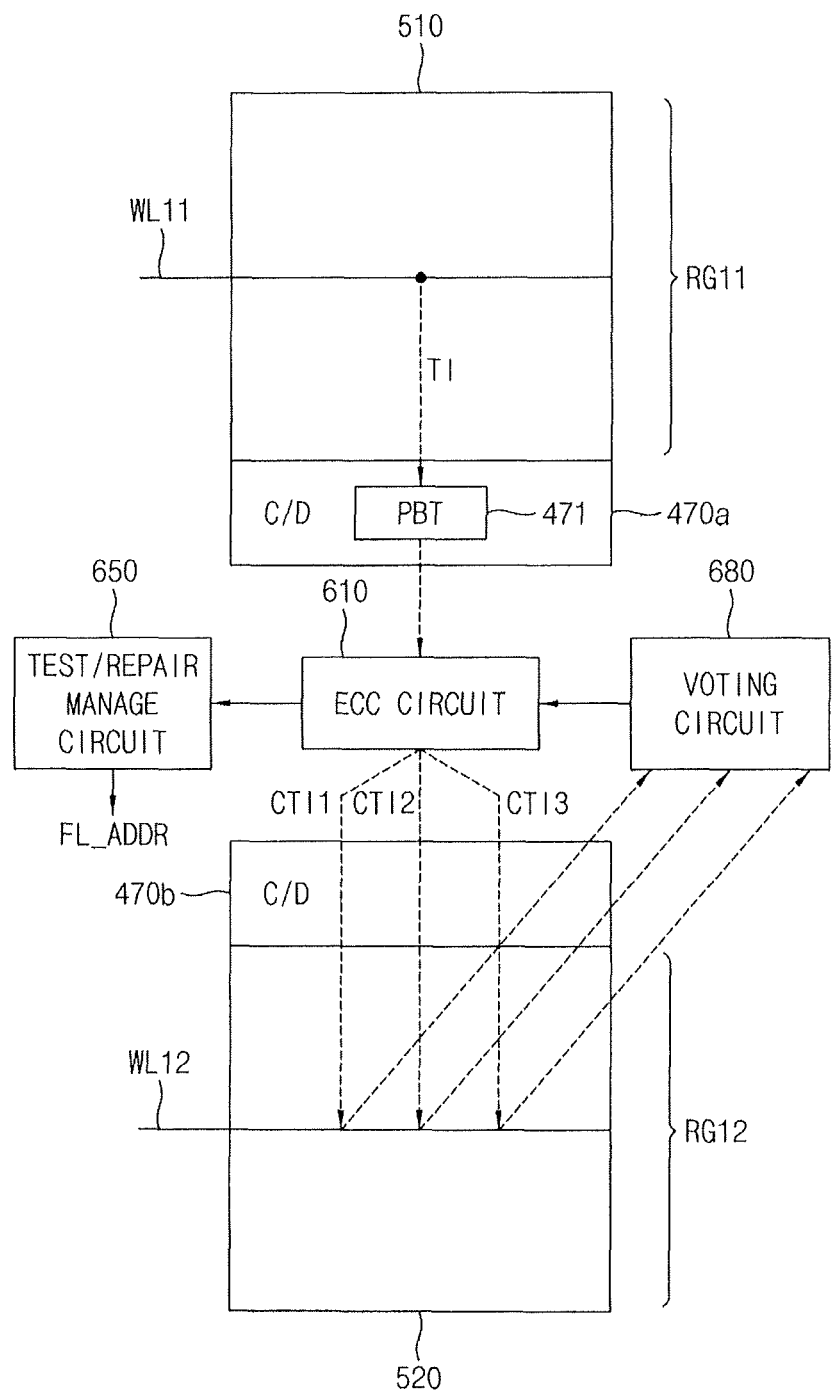
FIG. 37A illustrates that a test operation is performed in the semiconductor memory device of FIGS. 30 A and 33 according to exemplary embodiments.

FIG. 37A illustrates performance of a test operation in the semiconductor memory device of FIGS. 30A and 33 according to exemplary embodiments.

Referring to FIG. 37A, a first region RG11 including memory cells to be tested belongs to the first bank array 510 and a second region RG12 in which the fail address FL_ADDR is stored belongs to the second bank array 520.

In the test mode, a test employing a plurality of test items is performed on memory cells coupled to a first word-line WL11 in the first region RG11, and test result information TI associated with the test is accumulated in a parallel bit test 471 in the first column decoder 470a. When the test on the memory cells coupled to a first word-line WL11 is completed for the test items and a failure is detected, an address of the first word-line WL11 is provided to the error correction circuit as a fail address. The error correction circuit 610 encodes the address of the first word-line WL11 and redundantly stores encoded fail addresses CTI1~CTI3 in a second word-line WL12 in the second region RG12. The error correction circuit 610 may increase robustness of the encoded fail addresses CTI1~CTI3 by redundantly storing the fail addresses CTI1~CTI3 in the second word-line WL12 in the second region RG12.

The encoded fail addresses CTI1~CTI3 redundantly stored in the second region RG12 are provided to a majority voting circuit 680. The majority voting circuit 680 performs a majority voting on the encoded fail addresses CTI1~CTI3, selects one of the encoded fail addresses CTI1~CTI3, which indicates majority (that is, which receives a majority vote), and provides the encoded fail address which is selected to the error correction circuit 610. The error correction circuit 610 decodes the encoded fail address and provides the decoded fail address to the test/repair manage circuit 650. The test/repair manage circuit 650 provides the fail address FL_ADDR to the anti-fuse box 670 and the anti-fuse box 670 programs the fail address FL_ADDR in the anti-fuse array 671.

In example embodiments, the parallel bit test 471 may store the test result information TI redundantly in the second word-line WL12 in the second region RG12 without using the error correction circuit 610.

Figure 37B:
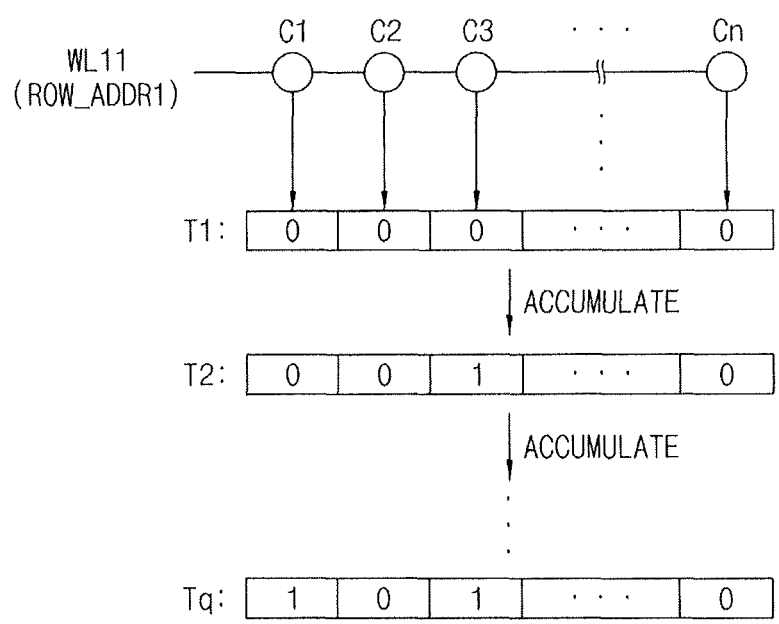
FIG. 37B illustrates that test result is accumulated for a plurality of test items in the test operation in FIG. 37A.

FIG. 37B illustrates that a test result is accumulated for a plurality of test items in the test operation in FIG. 37A.

Referring to FIG. 37B, the test is performed on memory cells C1~Cn coupled to the first word-line WL11 for each of the plurality of test items T1~Tq, the test result is accumulated on a word-line basis in the parallel bit tester 471. In FIG. 37B, a first logic level '1' indicates that the test result on a test item is 'fail'. When the test result for the plurality of test items T1~Tq is accumulated, the memory cells C1~Cn coupled to the first word-line WL11 indicate three or more failed cells, indicated by "1." Therefore, an address ROW_ADDR1 of the first word-line WL11 is determined as a fail address and the address ROW_ADDR1 of the first word-line WL11 is stored in the second region RG12. The memory cells in the first region RG1 are tested for the plurality of test items on a word-line basis, the test result is transferred to the second region RG12 and the test result for each of the test items is accumulated in the second region RG12.

In some embodiments, the memory cells in the first region RG1 are tested for the plurality of test items by a repair unit of the semiconductor memory device 400a, and the test result is accumulated and stored in the second region RG12.

When the error correction circuit 610 is employed as in FIG. 37A, failed cells in a codeword, which the error correction circuit 610 can correct, may be excluded from counting the failed cells.

Figure 38:
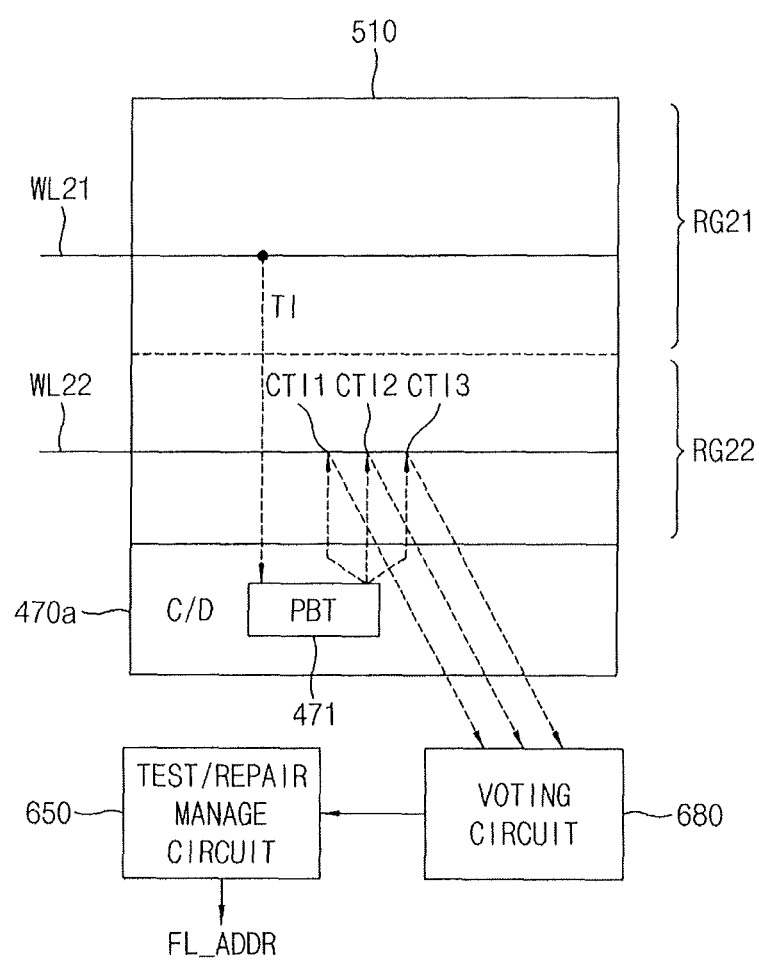
FIG. 38 illustrates that a test operation is performed in the semiconductor memory device of FIGS. 30 A and 33 according to exemplary embodiments.

FIG. 38 illustrates performance of a test operation in the semiconductor memory device of FIGS. 30 A and 33 in accordance with principles of inventive concepts.

Referring to FIG. 38, a first region RG21 including memory cells to be tested belongs to the first bank array 510 and a second region RG22 in which the fail address FL_ADDR is stored also belongs to the first bank array 510.

In the test mode, the test for a plurality of test items is performed on memory cells coupled to a word-line WL21 in the first region RG11, and test result information TI associated with the test is accumulated in the parallel bit test 471 (also referred to herein as parallel bit test storage 471) in the first column decoder 470a. When the test on the memory cells coupled to the word-line WL21 is completed for the test items, an address of the word-line WL21 is compressed in the parallel bit test 471. The parallel bit test 471 redundantly stores compressed fail addresses CTI1~CTI3 in a word-line WL22 in the second region RG22. That is, values of a word line associated with addresses of failed memory locations is compressed and redundantly stored in region RG22.

The compressed fail addresses CTI1~CTI3 redundantly stored in the second region RG22 are provided to the majority voting circuit 680. The majority voting circuit 680 performs a majority voting on the compressed fail addresses CTI1~CTI3, selects one of the encoded fail addresses CTI1~CTI3, which indicates majority, and provides the compressed fail address that is thus-selected to the test/repair manage circuit 650. The test/repair manage circuit 650 provides the fail address FL_ADDR to the anti-fuse box 670 and the anti-fuse box 670 programs the fail address FL_ADDR in the anti-fuse array 671 to redirect access to a properly functioning memory location away from the failed memory location FIG. 39 illustrates that a test operation is performed in the semiconductor memory device of FIGS. 30 A and 33 according to exemplary embodiments.

Figure 39:
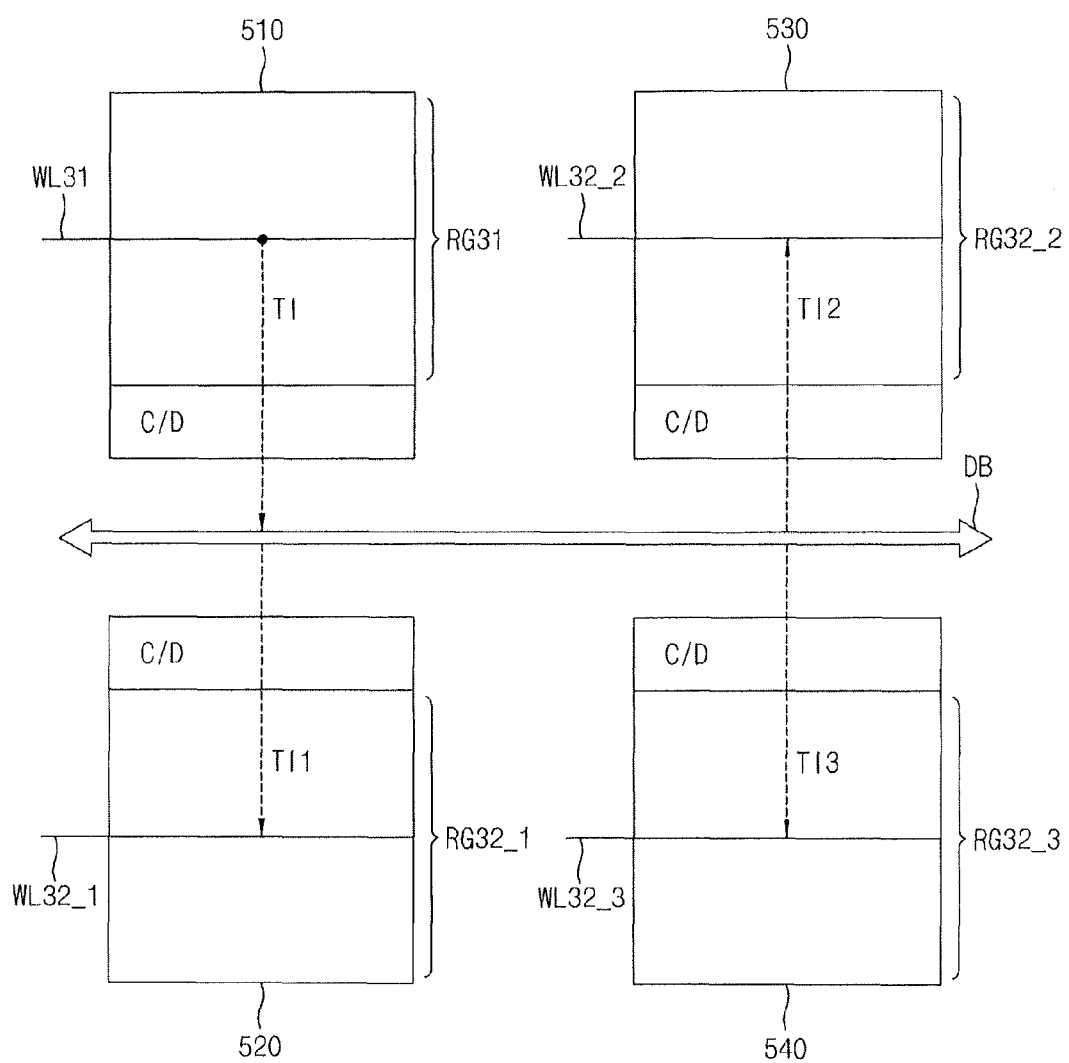
FIG. 39 illustrates that a test operation is performed in the semiconductor memory device of FIGS. 30 A and 33 according to exemplary embodiments.

Referring to FIG. 39, a first region RG31 including memory cells to be tested belongs to the first bank array 510 and second regions RG32_1~RG32_3 in which the fail address FL_ADDR is stored also belong to each of the second through fourth bank arrays 520, 530 and 540.

In the test mode, when the test on the memory cells coupled to the word-line WL31 is completed for the test items, an address of a word-line WL21 as a test result information TI is delivered to the second regions RG32_1~RG32_3 through a data bus DB, and the test result information TI is stored in each page coupled to each of word-lines WL32_1, WL32_2 and WL32_3 in each of second through fourth bank arrays 520, 530 and 540 as each of fail addresses TI1, TI2 and TI3.

The fail addresses TI1, TI2 and TI3 stored in the pages coupled by the word-lines WL32_1, WL32_2 and WL32_3 are provided to the majority voting circuit 680 in FIG. 38. The majority voting circuit 680 performs a majority voting on the fail addresses TI1~TI3, selects one of the encoded fail addresses TI1~TI3, which indicates majority, and provides the fail address that is thus-selected to the test/repair manage circuit 650. The test/repair manage circuit 650 provides the fail address FL_ADDR to the anti-fuse box 670 and the anti-fuse box 670 programs the fail address FL_ADDR in the anti-fuse array 671.

Figure 40:
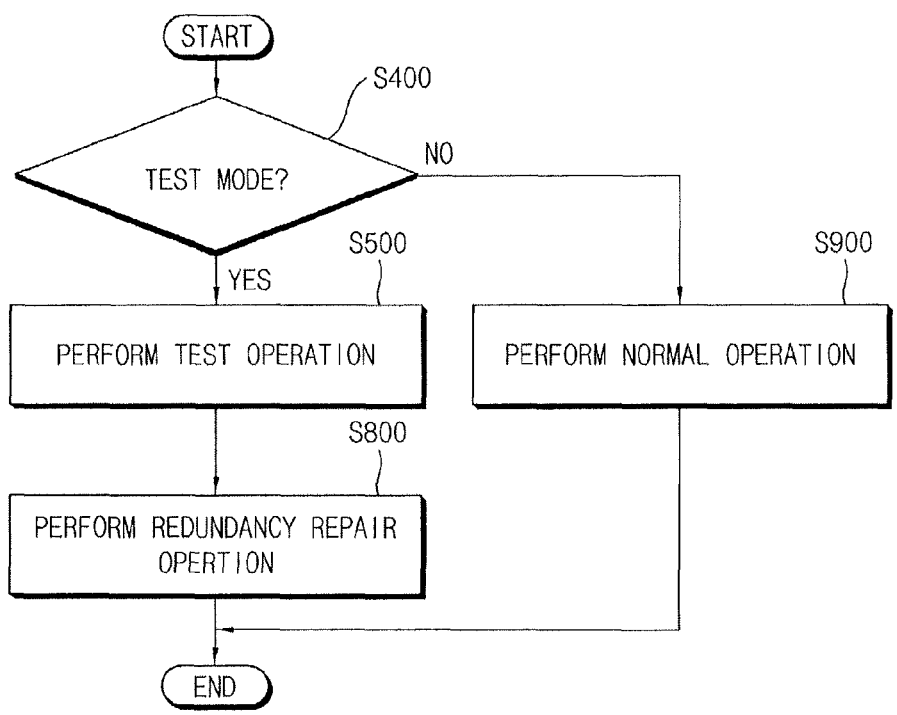
FIG. 40 is a flow chart illustrating a method of operating a semiconductor memory device according to exemplary embodiments.

FIG. 40 is a flow chart illustrating an example embodiment of a method of operating a semiconductor memory device in accordance with principles of inventive concepts.

Referring to FIGS. 30 through 40, in a method of operating a semiconductor memory device 400a including a plurality of bank arrays 510~580, the control logic circuit 410a decodes a command CMD from the memory controller 30 to determine whether the command CMD designates a test mode (S400).

In the event the command CMD designates a test mode (YES in S400), the test/repair manage circuit 650 performs a test operation on memory cells in the memory cell array 500 in response to the mode signal MS indicating the test mode (S500). When the test operation on the memory cells is completed, the test/repair manage circuit 650 programs the fail address FL_ADDR in the anti-fuse box 670 and the anti-fuse box 670 performs a redundancy repair operation that outputs the redundancy address RP_ADDR when an address corresponding to the fail address FL_ADDR is input to the anti-fuse box 670 (S800). The redundancy repair operation may be referred to as a post package repair (PPR) or a repair on system (ROS) because the redundancy repair operation is performed after the semiconductor memory device 400a is packaged. That is, a system and method in accordance with principles of inventive concepts, may employ a self-test to identify memory cells that are defective and operate upon anti-fuses to redirect attempted accesses to a failed cell to an operational cell that is, through operation of the anti-fuses, associated with the address that originally accessed the failed cell.

When the command CMD does not designate the test mode (NO in S400), the control logic circuit 410 performs normal memory operation on the memory cell array such as refresh operation, write operation and read operation (S900).

Figure 41:
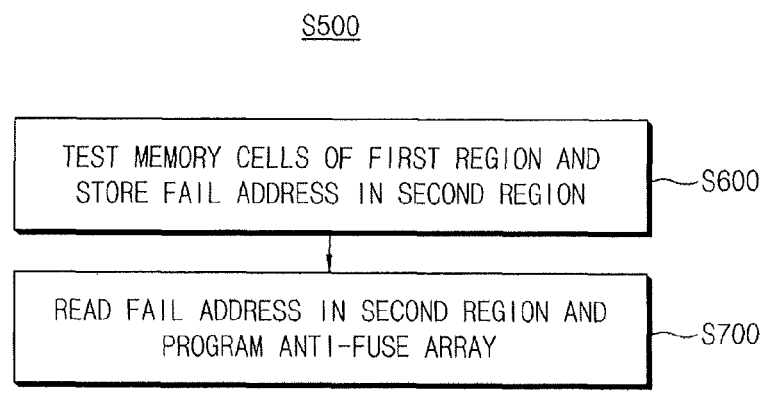
FIG. 41 is a flow chart illustrating the test operation in FIG. 40 according to exemplary embodiments.

FIG. 41 is a flow chart illustrating an example embodiment of a test operation in FIG. 40 in accordance with principles of inventive concepts.

Referring to FIGS. 30 to 41, for performing the test operation on the memory cells in the memory cell array 500 (S500), the test/repair manage circuit 650 tests memory cells in the first region and stores a fail address associated with a word-line including one or more failed cells in the second region of the memory cell array 500 (S600). When the test/repair manage circuit 650 is testing the memory cells in the first region and the test/repair manage circuit 650 detects one or more failed cells in the first region, the test/repair manage circuit 650 determines the fail address corresponding to the detected one or more failed cells and stores the determined, or identified, fail address (that is, address of the failed cell(s)) in the second region of the memory cell array 500.

As described above, the first region and the second region belong to different bank arrays of the memory cell array 500 respectively. The first region and the second region belong to different memory blocks in the same bank array of the memory cell array 500 respectively, and the different memory blocks do not share a bit-line sense amplifier.

As described above, the test/repair manage circuit 650 tests the memory cells in the first region for a plurality of test items on a word-line basis and determines the fail address by accumulating the test result. When the test/repair manage circuit 650 stores the fail address in the second region of the memory cell array 500, the test/repair manage circuit 650 may increase robustness of the stored fail address by storing redundantly the fail address in the second region.

The test/repair manage circuit 650 reads the fail address stored in the second region of the memory cell array 500 and programs the read fail address in the anti-fuse array 671 (S700) to redirect accesses away from the failed cell.

As described above, when the test/repair manage circuit 650 reads the fail address stored in the second region of the memory cell array 500, the majority voting circuit 680 performs a majority voting on the fail addresses which are redundantly stored in the second region and the error correction circuit 610 decodes a fail address which is selected by majority voting.

Figure 42:
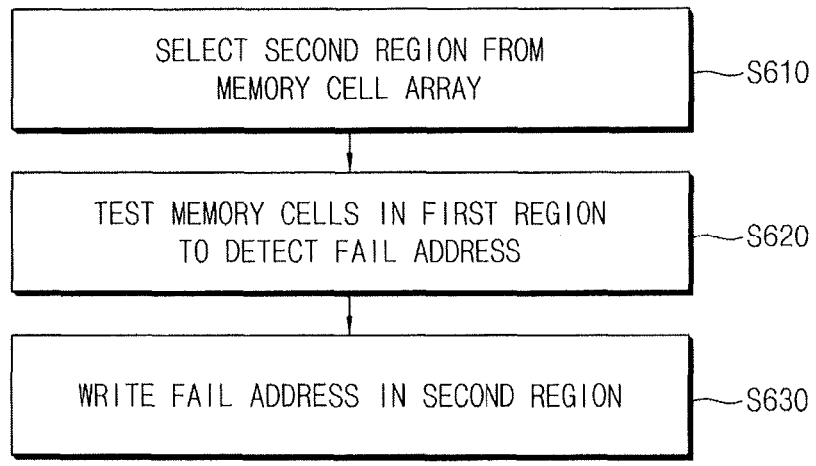
FIG. 42 is a flow chart illustrating an example of testing the memory cells in the first region in FIG. 41.

FIG. 42 is a flow chart illustrating an example embodiment of testing the memory cells in the first region in FIG. 41 in accordance with principles of inventive concepts.

Referring to FIGS. 30 through 39, 41 and 42, the test/repair manage circuit 650 selects a second region in which the fail address is to be stored in the memory cell array (S610). The second region may be selected based on a predetermined address, for example. The second region may be selected based on the test pattern, for example.

The test/repair manage circuit 650 tests the memory cells in the first region to determine a fail address corresponding to detected one or more failed cells (S620).

The test/repair manage circuit 650 stores the determined fail address redundantly in the second region of the memory cell array (S630).

Figure 43:
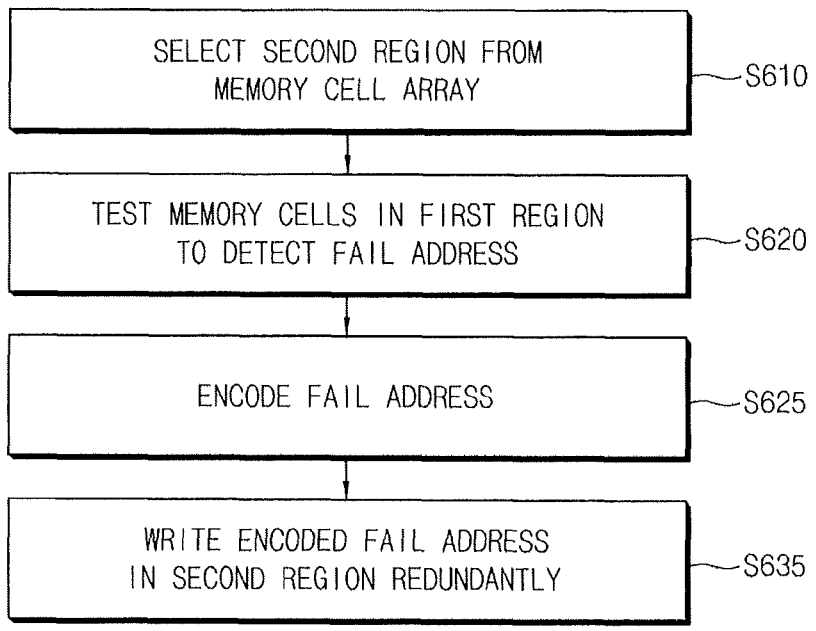
FIG. 43 is a flow chart illustrating another example of testing the memory cells in the first region in FIG. 41.

FIG. 43 is a flow chart illustrating another example of testing the memory cells in the first region in FIG. 41.

In FIG. 43, the steps S610 and S620 are the same as in FIG. 42, and thus a detailed description on the steps S610 and S620 will not be repeated here.

Referring to FIGS. 30 through 39, 41 and 43, the error correction circuit 610 encodes the fail address and provides the encoded fail address to the test/manage repair circuit 650 (S325). The test/repair manage circuit 650 stores the encoded fail address redundantly in the second region of the memory cell array (S635).

Figure 44:
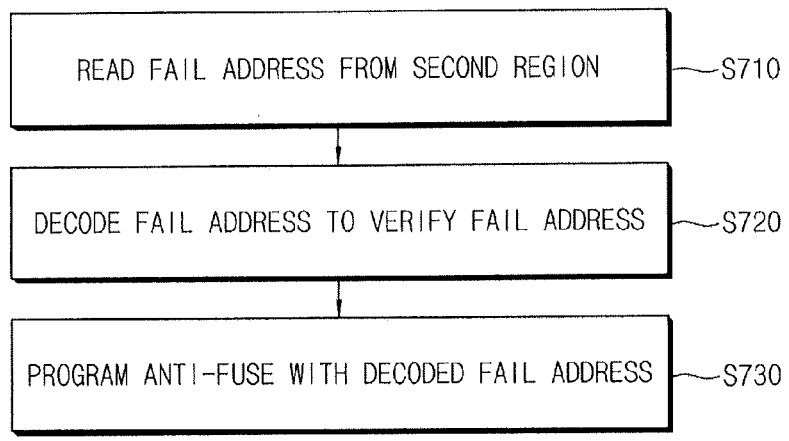
FIG. 44 is a flow chart illustrating an example of reading the fail address in FIG. 41.

FIG. 44 is a flow chart illustrating an example embodiment of reading the fail address in FIG. 41 in accordance with principles of inventive concepts.

In FIG. 44, it is assumed that the fail address is encoded and the encoded fail address is stored in the second region of the memory cell array 500.

Referring to FIGS. 30 through 39, 41 and 44, the fail address is read from the second region of the memory cell array, and the read fail address is provided to the error correction circuit 610 (S710). Before the read fail address is provided to the error correction circuit 610, majority voting may be performed on the fail addresses which are redundantly stored in the second region. The error correction circuit 610 decodes the fail address (that is, the fail address that has "won" the majority vote) to verify the fail address (S720). The error correction circuit 610 provides the decoded fail address to the anti-fuse box 670 and the anti-fuse box 670 programs the decoded fail address in the anti-fuse array 671 (S730).

Figure 45:
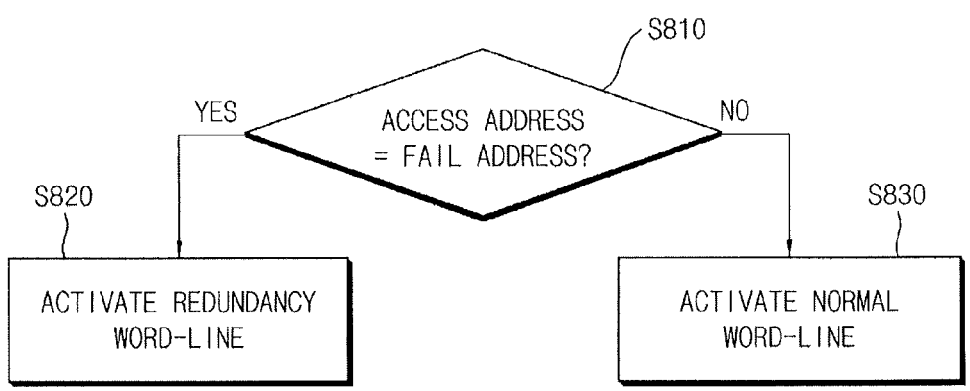
FIG. 45 is a flow chart illustrating an example of redundancy repair operation in FIG. 40.

FIG. 45 is a flow chart illustrating an example embodiment of redundancy repair operation in FIG. 40 in accordance with principles of inventive concepts.

Referring to FIGS. 30 through 39, 40 and 45, the anti-fuse box 670 determines whether an access address is the same as the fail address (S810). When the access address is the same as the fail address (YES in S810), the anti-fuse box 670 provides the row decoder 460 with the repair address RP_ADDR that replaces the access address and the row decoder 460 activates the redundancy word-line RWL (S820). When the access address is not the same as the fail address (NO in S810), the anti-fuse box 670 provides the row decoder 460 with the access and the row decoder 460 activates the normal word-line NWL corresponding to the access address (S830).

As described above, in a test mode, the test/repair manage circuit 650 tests the memory cells in the first region of the memory cell array and stores a fail address(es) corresponding to one or more failed cells in the second region of the memory cell array. Therefore, in accordance with principles of inventive concepts, semiconductor memory device 400a may increase usability of the memory cell array in the test mode, may not require an extra memory that stores the fail address during the test operation, and the semiconductor memory device 400a may decrease an occupied area. In addition, because, in accordance with principles of inventive concepts, the repair operation may be performed after the semiconductor memory device is packaged, performance of the semiconductor memory device may be enhanced.

Figure 46:
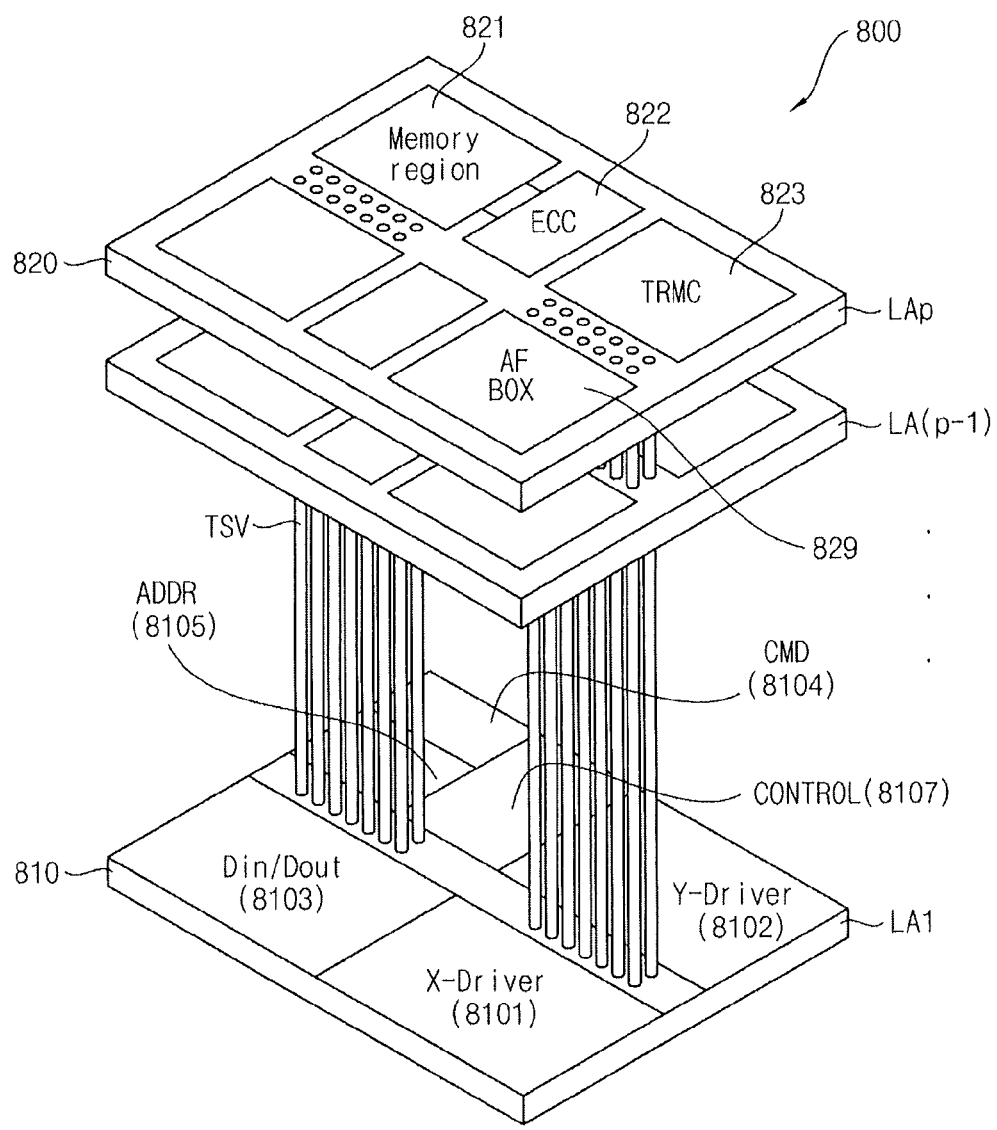
FIG. 46 is a structural diagram illustrating a semiconductor memory device according to exemplary embodiments.

FIG. 46 is a structural diagram illustrating an exemplary embodiment of a semiconductor memory device in accordance with principles of inventive concepts.

Referring to FIG. 46, a semiconductor memory device 800 may include first through pth semiconductor integrated circuit layers LA1 through Lap (p is a natural number greater than two), in which the lowest first semiconductor integrated circuit layer LA1 is assumed to be an interface or control chip and the other semiconductor integrated circuit layers LA2 through LAp are assumed to be slave chips including core memory chips. The first through kth semiconductor integrated circuit layers of layers LA1 through LAp may transmit and receive signals therebetween through through-silicon-vias (TSVs). The lowest first semiconductor integrated circuit layer LA1, as the interface or control chip, may communicate with an external memory controller through a conductive structure formed on an external surface. A description will be made regarding structure and an operation of the semiconductor memory device 800 by mainly using the first semiconductor integrated circuit layer LA1 or 810 as the interface or control chip and the nth semiconductor integrated circuit layer LAp or 820 as the slave chip.

The first semiconductor integrated circuit layer 810 may include various peripheral circuits for driving memory regions 821 provided in the pth semiconductor integrated circuit layer 820. For example, the first semiconductor integrated circuit layer 810 may include a row (X)-driver 8101 for driving word-lines of a memory, a column (Y)-driver 8102 for driving bit-lines of the memory, a data input/output unit (Din/Dout) 8103 for controlling input/output of data, a command buffer (CMD) 8104 for receiving a command CMD from outside and buffering the command CMD, and an address buffer (ADDR) 8105 for receiving an address from outside and buffering the address. The memory region 821 may include a plurality of memory cells, as described with reference to FIG. 34A, for example.

The first semiconductor integrated circuit layer 810 may further include a control logic circuit 8107. The control logic circuit 8107 may access the memory region 821 and may generate control signals for accessing the memory region 821 based on the command from the memory controller.

The pth semiconductor integrated circuit layer 820 may include an ECC circuit 822 that corrects errors in the memory cells in the memory region 821, a test/repair manage circuit 823, anti-fuse box 829 and a peripheral region in which peripheral circuits such as a row decoder, a column decoder, and a bit-line sense amplifier are disposed for writing/reading data in the memory region 821.

As described with reference to FIGS. 30 through 45, in a test mode the test/repair manage circuit 823 tests memory cells in a first region of the memory region 821, may detect one or more failed cells in the first region, determines a fail address corresponding to a detected one or more failed cells, and stores the fail address in a second region different from the first region (associated, for example, with a different word line), in the memory region 821. The anti-fuse box 829 programs the fail address in an anti-fuse array and outputs output a repair address that replaces the fail address. Therefore, the semiconductor memory device 800 does not require an extra memory that stores the fail address and the semiconductor memory device 800 may decrease an occupied area. In addition, the repair operation is performed after the semiconductor memory device 800 is packaged, performance of the semiconductor memory device 800 may be enhanced.

In addition, in some embodiments, a three dimensional (3D) memory array is provided in semiconductor memory device 800. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 47:
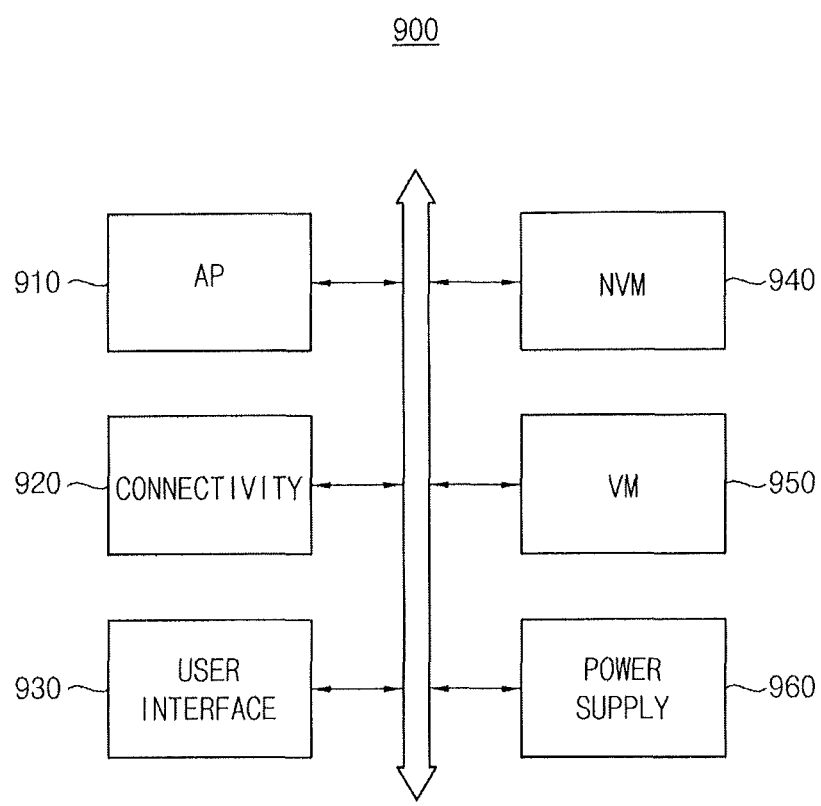
FIG. 47 is a block diagram illustrating a mobile system including the semiconductor memory device according to exemplary embodiments.

FIG. 47 is a block diagram illustrating a mobile system including the semiconductor memory device according to exemplary embodiments.

Referring to FIG. 47, a mobile system 900 may include an application processor 910, a connectivity unit 920, a semiconductor memory device 950, a nonvolatile memory device 940, a user interface 930 and a power supply 960.

The application processor 910 may execute applications, such as a web browser, a game application, a video player, etc. The connectivity unit 920 may perform wired or wireless communication with an external device.

The semiconductor memory device 950 may store data processed by the application processor 910 or operate as a working memory. The semiconductor memory device 950 may employ a semiconductor memory device such as memory device 400a of FIG. 30A and may, as a result, not require an extra memory that stores the fail address and the semiconductor memory device 950 may decrease an occupied area. In addition, because embodiments of the memory device 950 include circuitry in accordance with principles of inventive concepts, repair operation may be performed after the semiconductor memory device 950 is packaged and performance of the semiconductor memory device 950 may be enhanced.

The nonvolatile memory device 940 may store a boot image for booting the mobile device 900. The user interface 930 may include at least one input device, such as a keypad, a touch screen, etc., and at least one output device, such as a speaker, a display device, etc. The power supply 960 may supply a power supply voltage to the mobile system 900.

In some embodiments, the mobile system 900 and/or components of the mobile device 900 may be packaged in various forms.

Inventive concepts may be applied to systems using semiconductor memory devices, such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc., for example.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A method of operating a semiconductor memory device including a memory cell array that includes a plurality of bank arrays, the method comprising:
    testing memory cells in a first region of the memory cell array including the plurality of bank arrays;
    determining a fail address corresponding to a memory cell that fails the test; and
    storing the determined fail address in a second region in the memory cell array, the second region different from the first region,
    wherein the memory cells in the first region are connected to a plurality of word-lines,
    the memory cells in the first region are tested on word-line by word-line basis for each of a plurality of test items, each test result for each of the test items is transferred to the second region, and each test result for each of the test items is accumulated in the second region and the failed cell is detected based on the accumulated test results.

2. The method of claim 1, wherein the determined fail address is stored in the second region in a form of a look-up table.

3. The method of claim 1, wherein storing the determined fail address in the second region comprises:
storing the determined fail address in the second region redundantly.

4. The method of claim 1, wherein storing the determined fail address in the second region comprises:
encoding the determined fail address; and
storing the encoded fail address redundantly in the second region, and
wherein the determined fail address is encoded by an error correction circuit included in the semiconductor memory device.

5. The method of claim 1, further comprising:
reading the fail address stored in the second region to program the fail address in an anti-fuse array included in the semiconductor memory device.

6. The method of claim 5, wherein storing the determined fail address in the second region comprises:
encoding the determined fail address and
storing the encoded fail address redundantly in the second region,
wherein reading the fail address stored in the second region comprises:
reading the encoded fail addresses stored redundantly in the second region;
performing a majority voting on the encoded fail addresses to select an encoded fail address indicated by a majority vote; and
decoding the selected fail address.

7. The method of claim 1,
wherein, when the test on the memory cells in the first region for a plurality of test items is completed,
each test result for each of the test items is accumulated in the second region,
then, memory cells in the second region are tested,
wherein when each of the test items is not associated with a refresh period of the semiconductor memory device while the memory cells in the first region are being tested,
the memory cells in the first region are refreshed with a first refresh period longer than a standard refresh period, and
the memory cells in the second region are refreshed with a second refresh period equal to or shorter than the standard refresh period, and
wherein the memory cells in the first region and the memory cells in the second region provide a different reliability.

8. The method of claim 1,
wherein, when the test on the memory cells in the first region for a plurality of test items is completed,
each test result for each of the test items is accumulated in the second region,
then, memory cells in the second region are test,
wherein when one of the test items is associated with a refresh period of the semiconductor memory device while the memory cells in the first region are being tested,
the memory cells in the first region are refreshed with a refresh period required by the test item associated with the refresh period of the semiconductor memory device, and
wherein the memory cells in the first region and the memory cells in the second region provide a different reliability.

* * * * *